(12) United States Patent
Kunze et al.

(10) Patent No.: US 7,504,658 B2
(45) Date of Patent: Mar. 17, 2009

(54) SENSOR ELEMENTS WITH CANTILEVERED BAR STRUCTURES MADE OF SEMICONDUCTORS BASED ON GROUP III-NITRIDE

(76) Inventors: Mike Kunze, Helmstr. 16, Senden (DE) D-89250; Ingo Daumiller, Obere Weiherstrasse 1, Dietenheim (DE) D-89165; Peter Benkart, Kirchbergstrasse 12, Stotzard (DE) D-86447; Erhard Kohn, Radgebweg 21, Ulm/Lehr (DE) D-89081

( * ) Notice: Subject to any disclaimer, the term of this patent is extended or adjusted under 35 U.S.C. 154(b) by 15 days.

(21) Appl. No.: 10/549,438

(22) PCT Filed: Mar. 18, 2004

(86) PCT No.: PCT/EP2004/002817

§ 371 (c)(1),
(2), (4) Date: Jun. 5, 2006

(87) PCT Pub. No.: WO2004/083110

PCT Pub. Date: Sep. 30, 2004

(65) Prior Publication Data

US 2007/0176211 A1    Aug. 2, 2007

(30) Foreign Application Priority Data

Mar. 18, 2003    (DE)    ............................ 103 11 757

(51) Int. Cl.
*H01L 23/58* (2006.01)
(52) U.S. Cl. .................. 257/48; 257/415; 257/419; 257/467; 257/E27.008

(58) Field of Classification Search ................. 257/415, 257/419, 467, 469, 48; 438/50, 52
See application file for complete search history.

(56) References Cited

U.S. PATENT DOCUMENTS 6,647,796 B2    11/2003    Beach et al.

(Continued)

OTHER PUBLICATIONS

C. Youtsey, G. Bulman and I. Adesida, Dopant-Selective Photoenhanced Wet Etching of GaN, Journal of Electronic Materials, vol. 27, No. 4, 1998, Microelectronics Laboratory and Department of Electrical and Computer Engineering, Univ. of Illinois, Urbana, IL 61801, CREE Research, Inc. Durham, NC 27713.

(Continued)

*Primary Examiner*—Wai-Sing Louie
(74) *Attorney, Agent, or Firm*—Brinks Hofer Gilson & Lione

(57) ABSTRACT

The present invention relates to a sensor element which has a semiconductor structure based on a Group III-nitride. The semiconductor sensor element serves for determining the pressure, the temperature, a force, a deflection or an acceleration. It has a substrate base 1, disposed thereon, a homogeneous semiconductor layer based on a Group III-nitride, the surface of the homogeneous semiconductor layer 2 orientated towards the substrate base 1 having at least partially a spacing from the surface of the substrate base orientated towards the homogeneous semiconductor layer 2, 2f, and being distinguished in that at least two electrical conducting contacts 5 for conducting an electrical output signal, which can be generated by the homogeneous semiconductor layer 2, 2f, are disposed on, at or under the homogeneous semiconductor layer 2, 2f or are integrated in the latter.

53 Claims, 20 Drawing Sheets

U.S. PATENT DOCUMENTS

| | | | |
|---|---|---|---|
| 7,007,551 | B2 | 3/2006 | Zdeblick et al. |
| 7,013,734 | B2 | 3/2006 | Zdeblick et al. |
| 7,028,550 | B2 | 4/2006 | Zdeblick et al. |
| 7,066,031 | B2 | 6/2006 | Zdeblick et al. |
| 7,073,387 | B2 | 7/2006 | Zdeblick et al. |
| 7,086,288 | B2 | 8/2006 | Lee et al. |
| 7,181,972 | B2 | 2/2007 | Dasgupta et al. |
| 7,189,358 | B2 | 3/2007 | Beach et al. |
| 2002/0066319 | A1 | 6/2002 | Beach et al. |
| 2002/0067992 | A1* | 6/2002 | Bridger et al. ............... 417/53 |
| 2003/0089906 | A1* | 5/2003 | Ueda ......................... 257/55 |
| 2004/0065932 | A1* | 4/2004 | Reichenbach et al. ....... 257/415 |

OTHER PUBLICATIONS

Imaging Metallic Thin-Film Uniformity Using Nondestructive 1-20 GHz Magnetic Evanescent Microwave Probe, Electrical Engineering and Computer Science, Case Western Reserve University.

C. Bieth et al., Recent Development in ECR Sources, Nukleonika 2003; 48 (Supplement 2); S93-S98.

* cited by examiner

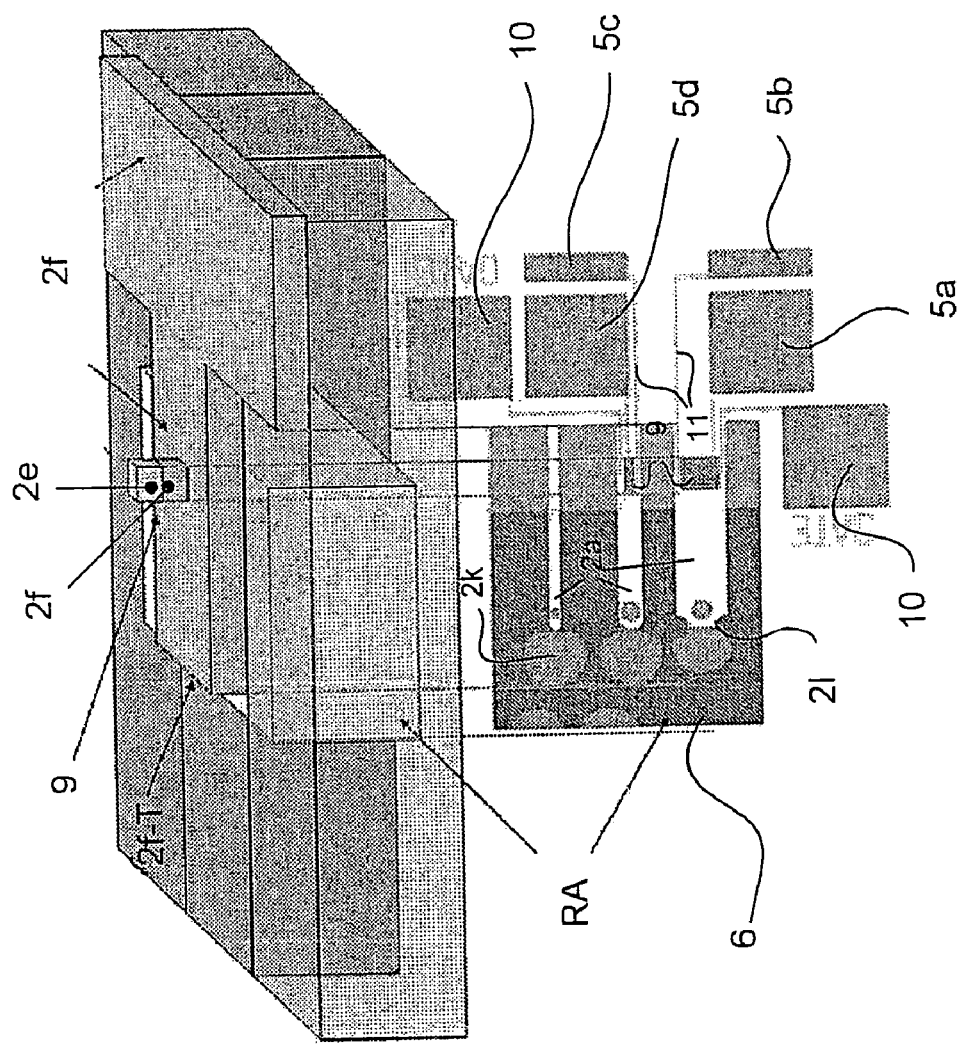
Fig. 8aII

SENSOR ELEMENTS WITH CANTILEVERED BAR STRUCTURES MADE OF SEMICONDUCTORS BASED ON GROUP III-NITRIDE

The present invention relates to a sensor element which has a semiconductor structure based on a Group III-nitride (for example comprising GaN, AlN or InN), the change in a physical variable (for example in a static and/or dynamic pressure—e.g. in flows of gases or fluids—in acoustic vibrations, in an acceleration, deflection or temperature) is determined in that the semiconductor structure converts the change in the physical variable by means of its piezoelectric properties into an electrical output variable or a corresponding output signal. Here as in the following, the description Group III or main Group III is used as an abbreviation for the third main group of the periodic table of elements.

Microsensors based on semiconductor structures based on a Group III-nitride are already known from the state of the art. Hence the patent specification U.S. Pat. No. 0,066,319 A1 shows a micromembrane which is connected to a substrate. A change in pressure produces a bulge in the membrane. This bulge is detected by means of a stress sensor fitted on the membrane and is converted by the stress sensor into an electrically measurable signal.

Starting from the state of the art, it is the object of the present invention to make available a semiconductor sensor element which, on a substrate base, has an integrated, cantilevered homogeneous semiconductor layer of such a type that the cantilevered integrated homogeneous semiconductor layer converts the change in a physical variable by changing its spatial state (for example, a deflection) by means of its piezoelectric properties into a measurable electrical output signal which can be conducted directly from the homogeneous semiconductor layer by conducting contacts fitted directly on, at and/or under the homogeneous semiconductor layer. It is furthermore the object of the invention to make available a corresponding measurement method and a corresponding method for structuring semiconductor sensor elements according to the invention.

This object is achieved by a sensor element according to patent claim 1, by a measurement method according to patent claim 50 and also by a semiconductor structuring method according to claim 53. Advantageous developments of the sensor element according to the invention or of the methods according to the invention are described in the respective dependent claims.

There is understood here as in the following by the term of homogeneous semiconductor layer, a layer constructed in the total layer volume uniformly from a semiconductor material based on a Group III-nitride (for example GaN). In contrast hereto, a heterostructure has at least two homogeneous semiconductor layers disposed on or next to each other (for example AlGaN/GaN heterostructure: AlGaN layer on GaN layer).

The semiconductor structures used according to the invention based on a Group III-nitride, such as for example gallium nitride, aluminium nitride or indium nitride, are distinguished by their piezoelectric properties relative to conventional structures. Said properties can be used for mechanical sensor technology since a polarisation is produced which is equiaxed over the crystal and dependent upon the distortion in the material, said polarisation being able to be evaluated for example by a change in charge carrier density on the surface or at the interface to a different material (heterostructure, for example AlGaN/GaN). The charge carriers hereby result directly from the polarisation. The basis of the sensors according to the invention is a mechanical change in the lattice which results in an electrically measurable change in the structure. As is known in theory, the polarisation in the material changes and hence the charge carrier density in a heterostructure channel with the change in the lattice constants. One possibility for producing sensor elements according to the invention is hence a heterostructure channel since, in the latter, an adequate charge carrier density can be achieved reliably. The exploitation of the properties of a heterostructure or of the heterostructure channel is however not definitely required in order to achieve a sensor structure according to the invention: it has been shown that, even with homogeneous semiconductor layers (for example made of undoped GaN), a sufficiently high signal-deflection ratio can be achieved. Only one volume material (GaN, InN, AlN, AlGaN, InGaN) is hence adequate for sensor applications. The piezoelectric material properties can be used for the purpose of producing structures which manage without doping with extraneous atoms in order to produce the conductivity. Likewise, the combination with doping is possible (p- or n-doping for example of the volume material for better contacting). Since the piezo properties of the material influence the free charge carriers in the volume materials or structures, the manipulation of the piezo properties is used according to the invention in order to produce sensor components. An external influence on the free charge carrier density in the component is hereby made use of.

The components produced on processable substrates (particularly advantageously on silicon substrates) are stripped of the substrate according to the invention partially or completely.

By mechanical bending of a volume material, p- or n-charge carriers are produced in the volume material according to the respective bending direction. For this reason, a p-contact and an n-contact can be used on these layers. Due to the diode behaviour of contacts of this type, current can then flow with corresponding bending but not with bending in the opposite direction.

The production of for example diode structures or transistor components based on Group III-nitrides makes possible in addition according to the invention the integration of the sensor components with electrical or electronic circuits. These can be for example compensation circuits (e.g. against external influences) or amplifier circuits (for example for signal amplification).

A semiconductor sensor element according to the invention has a substrate base and a homogeneous semiconductor layer which is disposed on this substrate base and based on nitrides of the main Group III elements, the surface of the homogeneous semiconductor layer orientated towards the substrate base at least partially not abutting directly on the substrate base or having a spacing from the surface of the substrate base orientated toward the homogeneous semiconductor layer and being distinguished in that at least two electrical conducting contacts for conducting an electrical output signal which can be generated by the homogeneous semiconductor layer on the basis of a change in a physical variable to be determined by means of the semiconductor sensor element are disposed on, at and/or under the homogeneous semiconductor layer or are integrated in the latter.

In a first advantageous embodiment variant of the semiconductor sensor element according to the invention, at least one of the contacts is disposed in the region of the region (spaced region) of the homogeneous semiconductor layer, which region does not abut directly on the substrate base or has a spacing from the surface of the substrate base and at least one of the contacts is disposed in the region of a region (non-spaced region) of the homogeneous semiconductor layer, which region does abut directly on the substrate base or has no spacing from the surface of the substrate base.

In a further advantageous embodiment, the homogeneous semiconductor layer has a raised region or mesa region which, in the direction perpendicular to the surface of the substrate base orientated towards the homogeneous semiconductor layer, has a greater thickness than a region (non-mesa region) of the homogeneous semiconductor layer, which region abuts on this region in a direction parallel to the surface of the substrate base orientated towards the homogeneous semiconductor layer. Advantageously, the raised region or mesa region is hereby disposed such that it extends in a direction parallel to the surface of the substrate base orientated towards the homogeneous semiconductor layer partially over the spaced region of the homogeneous semiconductor layer and such that it extends partially over the non-spaced region of the homogeneous semiconductor layer. Advantageously, the transition from the spaced region to the non-spaced region is hereby effected in the direction parallel to the surface of the substrate base orientated towards the homogeneous semiconductor layer in the region of the centre of the raised region or mesa region. In a further advantageous embodiment variant, at least one of the contacts is disposed directly on and/or in the region of an outer edge of the raised region or mesa region. In a further advantageous embodiment, the homogeneous semiconductor layer in the non-mesa region in the direction perpendicular to the surface of the substrate base orientated towards the homogeneous semiconductor layer has a thickness of over 0.2 µm and/or below 50 µm, in particular of over 0.5 µm and/or below 5 µm, and/or the homogeneous semiconductor layer in the raised region or mesa region has the thickness of the non-mesa region and in addition a thickness of over 20 nm and/or below 1000 nm, in particular of over 50 nm and/or below 300 nm.

In a further advantageous embodiment variant, the substrate base is formed from silicon. In a further advantageous embodiment variant, the homogeneous semiconductor layer contains $Al_xGa_{1-x}N$ or $In_xGa_{1-x}N$ or $In_xAl_{1-x}N$ with a relative element content of $0 \leq x \leq 1.0$. The homogeneous semiconductor layer is formed particularly preferably from GaN. In a further advantageous embodiment variant, a spatial region present due to the spacing between the homogeneous semiconductor layer and the substrate base is not filled so that the semiconductor layer relative to the substrate base is at least partially cantilevered. In a further variant, this spatial region can also be filled at least partially with a non-metallic and non-semiconducting material. The material should hereby be chosen such that in particular the heat transfer properties and/or the mechanical properties and/or the high frequency properties of the sensor element can be improved. Examples of filling materials which can be used individually or fundamentally in any combinations are: $SiO_2$, $Si_xN_y$, (in particular SiN), DLC (diamond-like carbon), diamond, silicone-like filling materials, $Al_2O_3$, thermally conductive plastic materials (in particular Dow Corning Q3-3600, 1-41xx and/or SE44xx). In the previously described variants the homogeneous semiconductor layer can either be undoped or be p-doped or n-doped. In a further advantageous embodiment variant, a heterostructure is used instead of a volume material: for this purpose, there is disposed on or at the homogeneous semiconductor layer on the side thereof orientated away from the substrate base, a cover layer of $Al_yGa_{1-y}N$ or $In_yGa_{1-y}N$ or $In_yAl_{1-y}N$ with a relative element content of $0 \leq y \leq 1.0$. The cover layer is hereby disposed preferably only on or at the raised region or mesa region but not in the non-mesa region. For particular preference, the cover layer is formed from AlGaN, in particular with an element content of $0.1 \leq y \leq 0.3$, particularly preferred from $0.15 \leq y \leq 0.25$. The cover layer can hereby be mechanically distorted. It can furthermore likewise be undoped, p-doped or n-doped. Further corresponding semiconductor layers can be disposed on the cover layer. In the case of the doped variants, the doping material content is advantageously up to approx. $10^{20}$ per $cm^3$. Silicon and/or magnesium can be used advantageously as doping material. This can hereby concern volume dopings and/or pulsed dopings.

The described electrical conducting contacts are advantageously p- and/or n-contacts. In the heterostructure variants, the electrical conducting contacts are advantageously disposed such that, with their help, an electrical output signal (electrical output signal produced in the heterostructure channel) produced in the transition region between the homogeneous semiconductor layer and the cover layer can be conducted. The electrical conducting contacts are disposed for this purpose advantageously directly at the interface between the homogeneous semiconductor layer and the cover layer. Advantageously, the electrical conducting contacts have a metallisation which, for the n-contact, contains Ti and/or Al or is formed therefrom and/or which, for the p-contact, contains Ni and/or Au or is formed therefrom. The thickness of the metallisation is here advantageously up to 1000 nm, particularly preferred up to 200 nm.

The physical variable to be determined can be for example the pressure, the temperature, a force, a deflection or an acceleration. The change in the spatial state of the homogeneous semiconductor layer or of the heterostructure can hereby be a change in the shape, volume, structure, one of the surfaces or simply a deflection or bulge relative to the substrate base. The output signal can be detected in particular in the form of a current, a voltage or an electrical resistance or change in the same.

In further advantageous embodiments of the sensor element according to the invention, the homogeneous semiconductor layer at one or more anchor points is connected to the substrate base such that at least one part of the part of the homogeneous semiconductor layer connected at the anchor point or anchor points is cantilevered relative to the substrate base and can be deflected directly relative to the substrate base by a change in the physical variable to be determined. In a further variant, the sensor element or the homogeneous semiconductor layer is configured as a functional unit with integrated electrical or electronic circuits made of semiconductor structures based on a main Group III-nitride. Preferably, the circuits hereby have diode structures, transistor elements or temperature sensor elements. They can represent compensation circuits or amplifier circuits, in particular for signal amplification. The output signal in a further embodiment can be conducted by means of Schottky contacts. The circuits can be configured as Wheatstone bridges.

The previously described semiconductor sensor element according to the invention has a series of advantages:
  novel sensor applications in a functional unit with integrated electronic circuits based on a Group III-nitride can be produced.
  economical novel sensor elements can be produced reproducibly in combination with silicon substrates.
  multiple applications are possible in the field of sensor or micromechanics technology, new application fields can be developed due to the material properties of the Group III-nitrides of the sensor elements, for example in the field of high temperature applications.
  since the sensor itself is a cantilevered active component which converts the change in the physical variable directly into an electrical signal, the sensor itself can be pre-distorted or pre-deformed. As a result, a temperature compensation is for example possible.

Sensor elements according to the invention can be embodied, used or produced in one of the subsequent examples. In the Figures corresponding to the individual examples, corresponding or identical components of the sensor elements are provided with the same reference numbers.

Figure 1A:
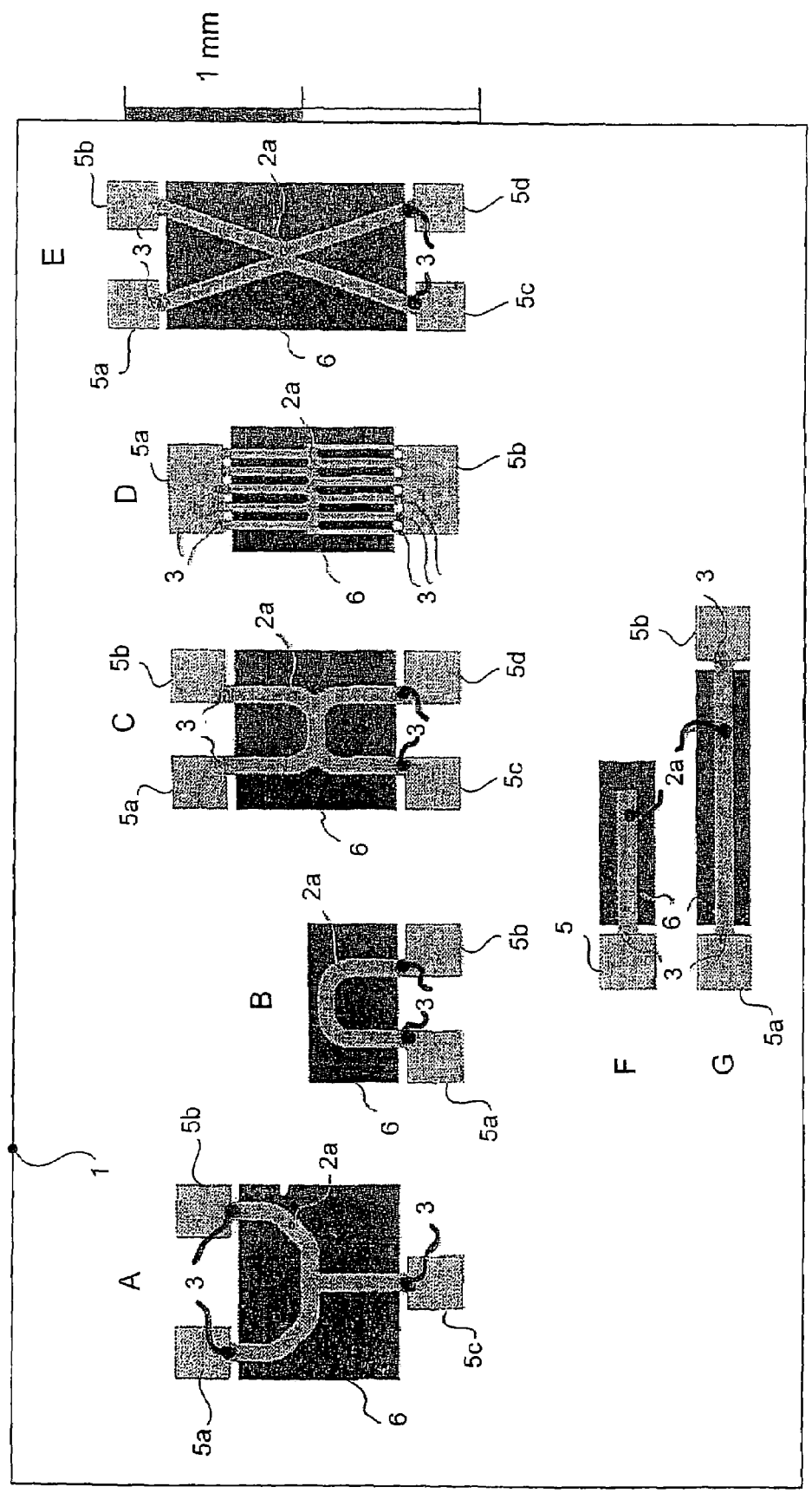
FIG. 1 shows various possibilities for configuring the shape of a sensor element according to the invention.
Figure 1B:
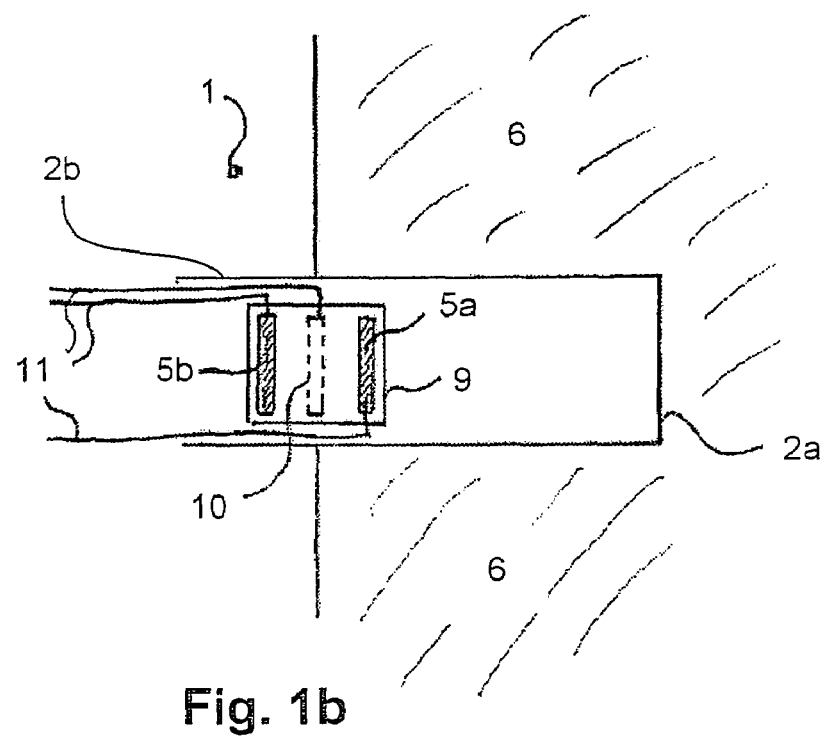
Figure 1C:
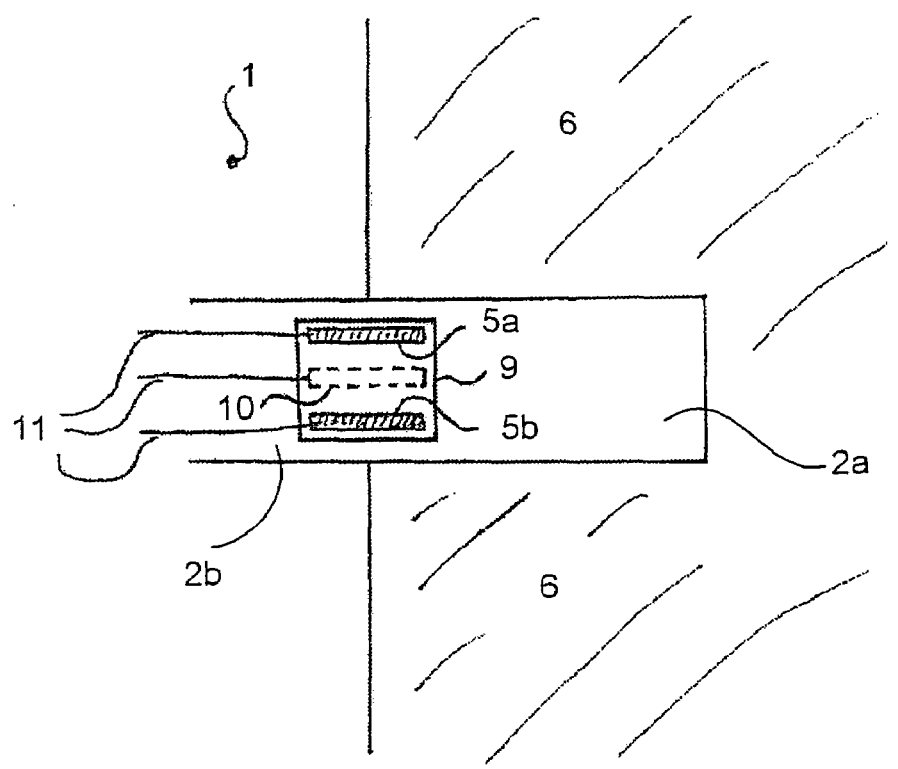

FIG. 1a shows seven different embodiments of a sensor element according to the invention. In each of the partial FIGS. 1A to 1G, one embodiment is shown in plan view on the substrate base layer 1. Each of the embodiments has a silicon substrate 1 and, disposed thereon, a homogeneous semiconductor layer 2 or a part, remaining after etching out of a desired geometric structure, of an overall layer formerly completely covering the substrate 1. A part 2a of the (remaining) homogeneous semiconductor layer 2 has a cantilevered configuration, i.e. is disposed above a cavity 6 etched in the substrate 1 such that the cantilevered part 2a can be deflected by the influence of the physical variable to be determined. The cantilevered part 2a or the homogeneous semiconductor layer 2 is connected to the substrate 1 via a varying number of anchor points 3. By deflection of the cantilevered part 2a, the polarisation in the material (volume material of the homogeneous semiconductor layer 2) changes and hence a changed charge carrier density is produced in the material or, if by applying further layers on the homogeneous semiconductor layer 2 a heterostructure is present, on the material surface or at the interface to a different material which, by means of contacts 5 which are applied at the edge of the cavity 6 on the silicon substrate 1, are disposed on the homogeneous semiconductor layer 2 or the anchor points 3 thereof and abut directly on the semiconductor layer 2, is tapped preferably in the form of a current change. In FIG. 1A, the cantilevered, deflectable part 2a of the homogeneous semiconductor layer 2 is connected to the substrate base 1 via three anchor points 3 such that the deflectable part 2a is an essentially Y-shaped bar. The three anchor points 3 and also three associated contacts 5a-5c are disposed at the three ends of the Y- or of the corresponding bar. The Y-bar form has the advantage that a great change in the charge carrier density can be expected with a small mechanical deflection. In FIG. 1B, the cantilevered deflectable part 2a of the homogeneous semiconductor layer 2 is connected to the substrate base 1 via two anchor points 3 of the homogeneous semiconductor layer 2 situated on the same side of the etched-out cavity 6 such that the cantilevered deflectable part 2a essentially represents a U-shaped bar. The two anchor points and the associated contacts 5a to 5b are disposed at both ends of the U or of the corresponding bar, hence therefore on the same side of the cavity 6 or at an edge side of the cavity 6. With a U-shaped bar, an effect occurring on the bending distortion close to the substrate edge can be measured without compensation thereby occurring due to bending in the opposite direction, as is the case with straight, double clamped bars. FIGS. 1C and 1E show a cantilevered, deflectable part 2a which is connected to the substrate base via four anchor points 3 such that the deflectable part 2a essentially represents an X- or H-shaped bar. The four anchor points are disposed at the four ends of the X- or H-bar. X- or H-shaped structures offer the advantage of being able to choose different measuring paths or being able to select the contacts 5 of the four contacts 5a to 5d which are used for the signal tapping. FIG. 1d shows a case in which the cantilevered, deflectable part 2a of the homogeneous semiconductor layer 2 is connected to the substrate base 1 via a multiplicity of anchor points 3 such that the cantilevered, deflectable part 2a essentially represents a double comb-shaped bar. The anchor points 3 or contacts 5a, 5b are disposed respectively at the ends of the comb tines or the individual bar ends. The comb shape relative to normal straight bars has the advantage of improved sensitivity. FIG. 1F shows a case in which a cantilevered, deflectable part 2a of the homogeneous semiconductor layer 2 is connected to the substrate base 1 via precisely one anchor point 3 such that a cantilevered deflectable linear bar is produced. The anchor point 3 is disposed at one of the ends of the bar, a first contact 5 at the anchor point 3. The counter-contact (not shown) is integrated in the part 2a at the free bar end. FIG. 1G shows a case in which a cantilevered, deflectable part 2a is connected to the substrate base 1 via precisely two anchor points 3 such that a cantilevered linear bar clamped on two sides is produced. The two anchor points 3 are situated at both ends of the linear bar just like the associated contacts 5a, 5b. The structures with at least two directly oppositely situated anchor points 3, i.e. as observed from above with anchor points 3 on two oppositely situated sides of the etched-out cavity 6, have the advantage that, via the corresponding bars by deflection of the centre, distortion can be achieved over the entire surface, i.e. additionally, as well as expansion and compression in the bending radii, also elongation of the bar and hence also expansion of the elementary cells can be achieved.

FIGS. 1b and 1c show two further sensor structures according to the invention which are constructed analogously to the sensor structure illustrated in FIG. 1F, i.e. are disposed only on one side on the substrate 1 (left side of the drawings), whilst the unsupported side 2a of the semiconductor layer 2 (right side of the drawings) is not connected to a carrier. The two illustrated structures have a GaN buffer layer 2 which is disposed in part on the substrate 1 and which is disposed in part (region 2a) cantilevered above the etched-out cavity 6. A cover layer made of AlGaN 9 in the form of a mesa is disposed on the GaN buffer layer 2a such that the mesa is disposed in part above the substrate 1 and in part above the etched-out cavity 6. Ohmic contacts (two contacts 5a and 5b are illustrated, however also more contacts can be applied) are fitted at the edge of the transition from the supported region (above the substrate 1) to the unsupported semiconductor region (above the etched-out cavity 6). In FIG. 1b, a configuration is shown, the two contacts 5a and 5b being fitted transversely relative to the bar extension (direction of substrate 1 to cavity 6 or in the Figure from left to right) on the mesa 9, the contact 5b in front of the transition, the contact 5a behind the transition). The ohmic contact 5a fitted behind the transition on the unsupported region 2a is guided electrically by means of a line 11 along the mesa 9 to the region in front of the transition. The second contact 5b is also provided with such a line 11. In the configuration shown in FIG. 1c, the two ohmic contacts 5a and 5b are fitted longitudinally relative to the bar extension, one at the upper edge on the mesa 9, one at the lower edge on the mesa 9. In this case, the contacts 5a and 5b cross the region of the transition of the semiconductor material 2 from the supported region above the substrate 1 to the unsupported region 2a. Optionally (therefore illustrated in broken lines), a control contact 10, analogous to a gate of a transistor (preferably in the form of a Shottky contact), can be disposed at a defined spacing from one of the ohmic contacts 5a and 5b. The spacing is preferably 0.3 µm to 0.5 µm. The gate 10 is likewise provided with an electrical supply line 11. Further control contacts or gates can also be disposed or used.

Figure 2A:
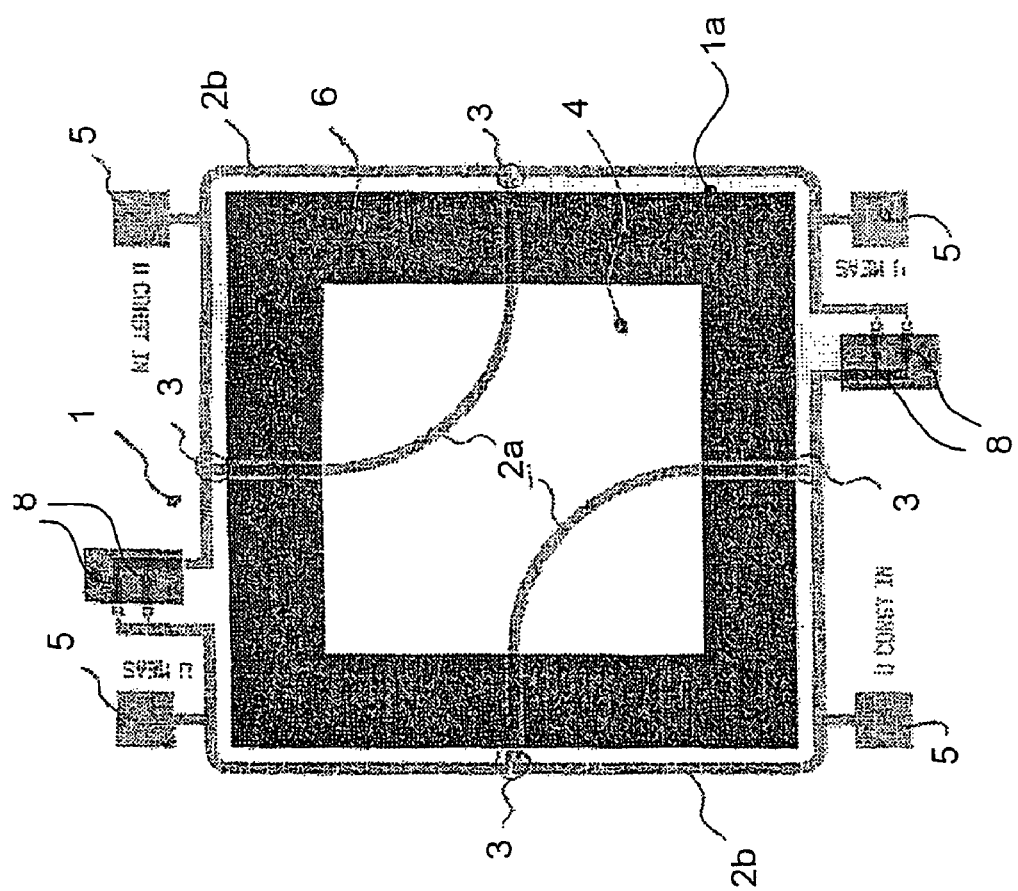
FIG. 2 shows acceleration sensors according to the invention.

FIG. 2a shows an acceleration sensor according to the invention. This acceleration sensor is likewise illustrated in plan view. The basic structure of the acceleration sensor hereby corresponds to the structure of the sensors illustrated in FIG. 1 (identical elements or components are provided with identical reference numbers). The acceleration sensor has two cantilevered bars 2a which are made of GaN and configured in the shape of a quarter circle, said bars being mounted respectively at two anchor points 3 at the substrate edge of the Si substrate 1. Each bar 2a hereby has two anchor points 3 at mutually abutting edges of the etched-free cavity 6 which is square in the illustrated section. The anchor points 3 or the bars 2a are connected to each other via portions 2b made of GaN of the homogeneous semiconductor layer 2, said portions being non-cantilevered and disposed in the vicinity of the substrate edge 1a or at the edges of the cavity 6. The portions 2b respectively connect the two anchor points 3 of each bar 2a. The contacts 5 are disposed on the portions 2b. On the cantilevered portions 2a, a seismic mass 4, which is square in the illustrated section, is mounted as central piece of the acceleration sensor. Said mass is situated entirely above the etched-out cavity 6 and is connected to the substrate base solely via the two curved bars 2a or the associated four anchor points 3. The meaning of the structures 8 is explained in the description of FIG. 2b (which shows a section of the acceleration sensor from FIG. 2a). If the sensor is subjected to an acceleration, the seismic mass 4 is deflected from its inoperative position. By deflection of the seismic mass 4, the bar portions 2a become distorted as a result of which there results a change in the resistance of the measurement strip 2a at the substrate edge. The change in the resistance of the measurement strip is measured by means of the contacts 5 via a Wheatstone circuit. Optionally, the sensor structure or the circuit can be provided also with gates (preferably as Schottky contacts, for example in the form of a metallisation with an Ni layer and an Au layer in a thickness of for example up to 200 nm, preferably in a thickness up to 20 nm) which are used for operating point adjustment or for compensation.

Figure 2B:
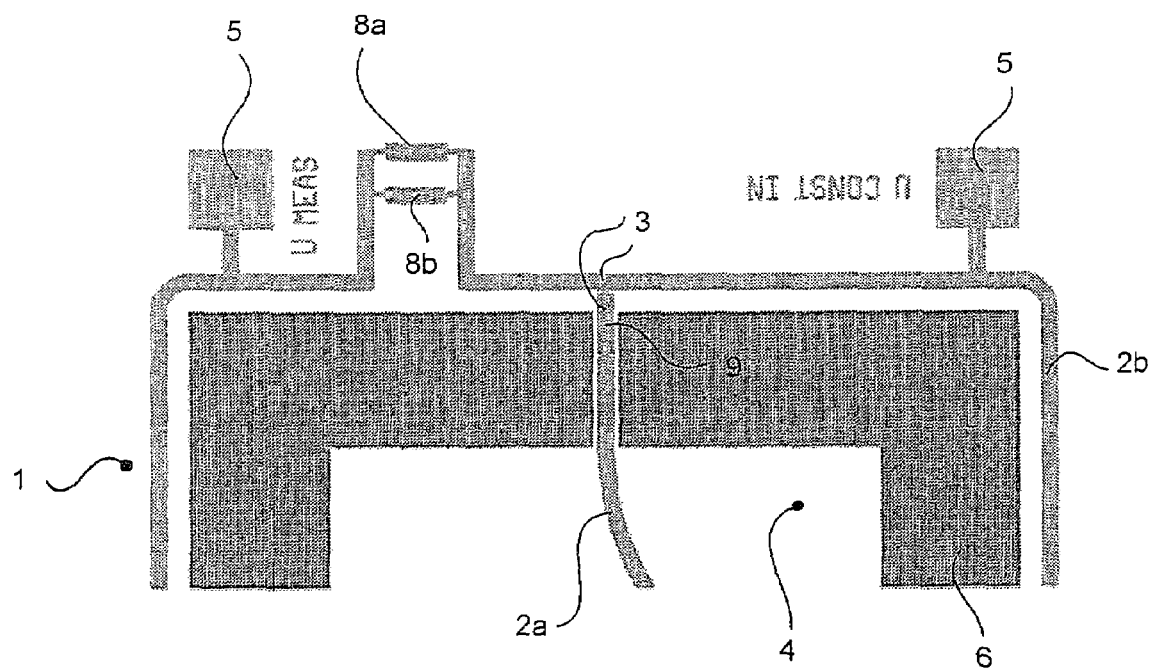

FIG. 2b shows a section of the acceleration sensor illustrated in FIG. 2a. The portions 2a and 2b of the homogeneous semiconductor layer 2 are provided everywhere with a metallisation layer except in the regions 8a, 8b and 9. The region 9 is hereby disposed directly on the shown anchor point 3 and is in part cantilevered (lower portion of the region 9) and in part non-cantilevered (upper portion or on the anchor point 3). The portions 8a, 8b and 9 represent raised regions or mesa regions of the homogeneous semiconductor layer 2, i.e. regions in which the thickness of the homogeneous semiconductor layer 2 is increased relative to the remaining regions of 2a and 2b. If instead of a homogeneous semiconductor layer 2 made of GaN, a heterostructure made of AlGaN/GaN is used, then the heterostructure is present only in the regions 9, 8a and 8b, in the remaining regions 2a and 2b only the buffer layer made of GaN and provided with the metallisation is then present. The mesa portions 8a, 8b and 9 are designated subsequently also alternatively as resistors. In the case of the shown acceleration sensor, the electrical signals used are produced per half arc 2a in the region of the anchor points 3 in the mesa region 9 or in the corresponding transition region from unsupported to fixed, since only in the region 9 does a mesa exist and since only here is the metallisation interrupted. In the remaining region of the unsupported bar 2a and also of the portion 2b of the homogeneous semiconductor layer 2 disposed in a fixed manner on the substrate, only the buffer material (GaN volume material) remains. Signal changes in the region of the cantilevered portion 2a not corresponding to the portion 9 (thus unsupported in the portion between the region 9 and the transition region to the seismic mass and in the region of the seismic mass) are not used in the above-described configuration since a completely closed metallisation is situated on the top. In the portion 2b of the homogeneous semiconductor layer 2, no signals are produced since here the homogeneous semiconductor layer 2 is not bent. As already described, the change in resistance of the measurement strip of the illustrated configuration is measured by means of the contacts 5 via a Wheatstone circuit. In the illustrated configuration, the structure and the mode of operation corresponds hence to a Wheatstone bridge with unknown resistors at the anchor points 3 (in total four resistors 9 in the illustrated configuration, cf. FIG. 2a) and resistors 8a, 8b which are likewise unknown but are produced identically to the resistors 9 and hence have an identical resistance value. The resistors 8a, 8b (in total four items, see FIG. 2a) are hence four identical unsupported resistors made of GaN bars with metallisation in a parallel circuit, which are not deflected. Upon deflection of the seismic mass 4, the four resistors 9 change at the points 3 but the four resistors 8 do not, so that the measurement signal (or the current) results as a difference. All interfering influences, such as for example light or temperature, have the same effect on the resistors 9 as on the resistors 8 so that this does not lead to signal differences but only a genuine deflection of the seismic mass 4. Optionally (not shown), the resistors 8 and/or 9 can also be configured with a gate (for example as Schottky contact).

Figure 2C:
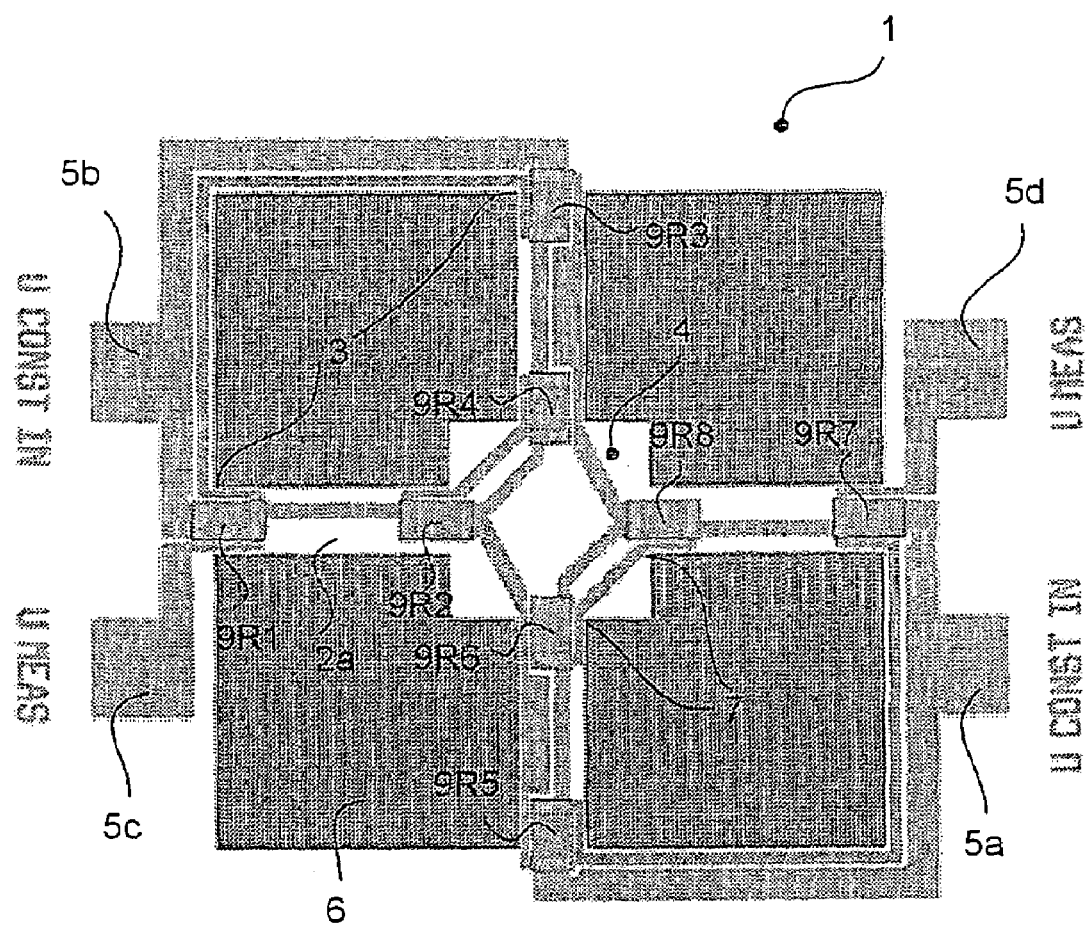
Figure 2D:
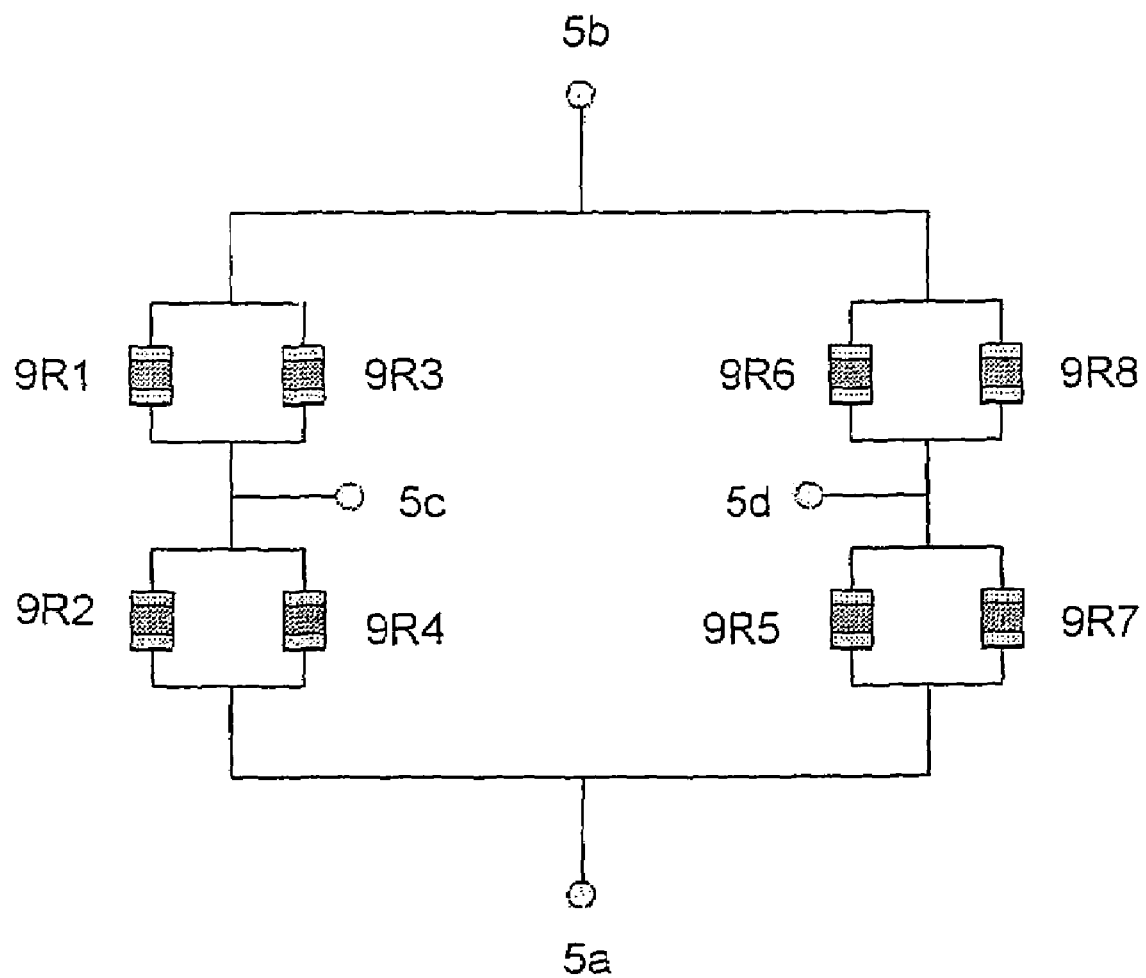

FIGS. 2c and 2d show a further acceleration sensor. The basic structure of the acceleration sensor shown in these Figures corresponds firstly to that acceleration sensor of FIGS. 2a and 2b. The difference is that, in addition to four resistors (here: 9R1, 9R3, 9R5 and 9R7) at the anchor points 3, the resistors are jointly used also at the transition from the seismic mass 4 to the unsupported bar 2a (transition region 7) in order to increase the signal generated upon deflection of the mass 4 (the resistors in the transition region 7 are provided in the Figure with the reference numbers 9R2, 9R4, 9R6 and 9R8). Upon deflection of the mass 4, the transition region 7 is curved into the exactly opposite direction to the deflection region at the anchor points 3 so that an oppositely-directed effect can be expected here. In the wiring, this is exploited in that the resistors are disposed electrically in the Wheatstone bridge such that the effect is summated: if for example 9R1 is deflected downwards (into the paper plane), then 9R2 is deflected upwards. This applies likewise then for 9R7 (downwards) and 9R8 (upwards). With the assumption that 9R1 becomes greater with the described deflection, the increase also applies for 9R7 (and 9R3 and 9R5), the resistors 9R2 and 9R8 (likewise 9R4 and 9R6) become smaller (opposite effect). Since the pairs of resistors 9R1 and 9R7 and also 9R2 and 9R8 are however disposed electrically in the circuit "via intersection", the effect is summated and a high current change or a high measurement signal results during deflection in contrast to the non-deflected state. The principle of the circuit is illustrated once again in FIG. 2d. The reference numbers 5a and 5b hereby designate the contacts, to which the input voltage ($U_{in}$) necessary for the measurement is applied, the reference numbers 5c and 5d the contacts at which the voltage or current is tapped during measurement. In the presented circuit, the bridges must be calibrated to 0 before operation, for example the current at the measuring points 5c and 5d is measured for this purpose when fed with a voltage at the contacts 5b and 5a. This produces the value without deflection. All changes in current are then produced upon a change in the deflection of the resistors 9 and hence are a measure of the deflection, without the resistors 9 or the value thereof being known precisely (as is otherwise normal for a Wheatstone circuit). Optionally, the resistors can also be configured with a gate (not illustrated here). Interfering influences can be calibrated out via reference resistors which are not deflected (analogously to the resistors 8 in FIG. 2b). If the resistors 9 are made electrically accessible individually or if they are triggered so to speak electrically by suitable wiring, i.e. each individual resistance value of the resistors 9 is measured, then it is even possible to indicate the direction of the deflection of the mass 4 (for example for the position of a car on the ground) since a symmetrical deflection of the mass 4 is no longer produced and hence the resistors 9 also change their value as a function of the location.

Figure 2E:
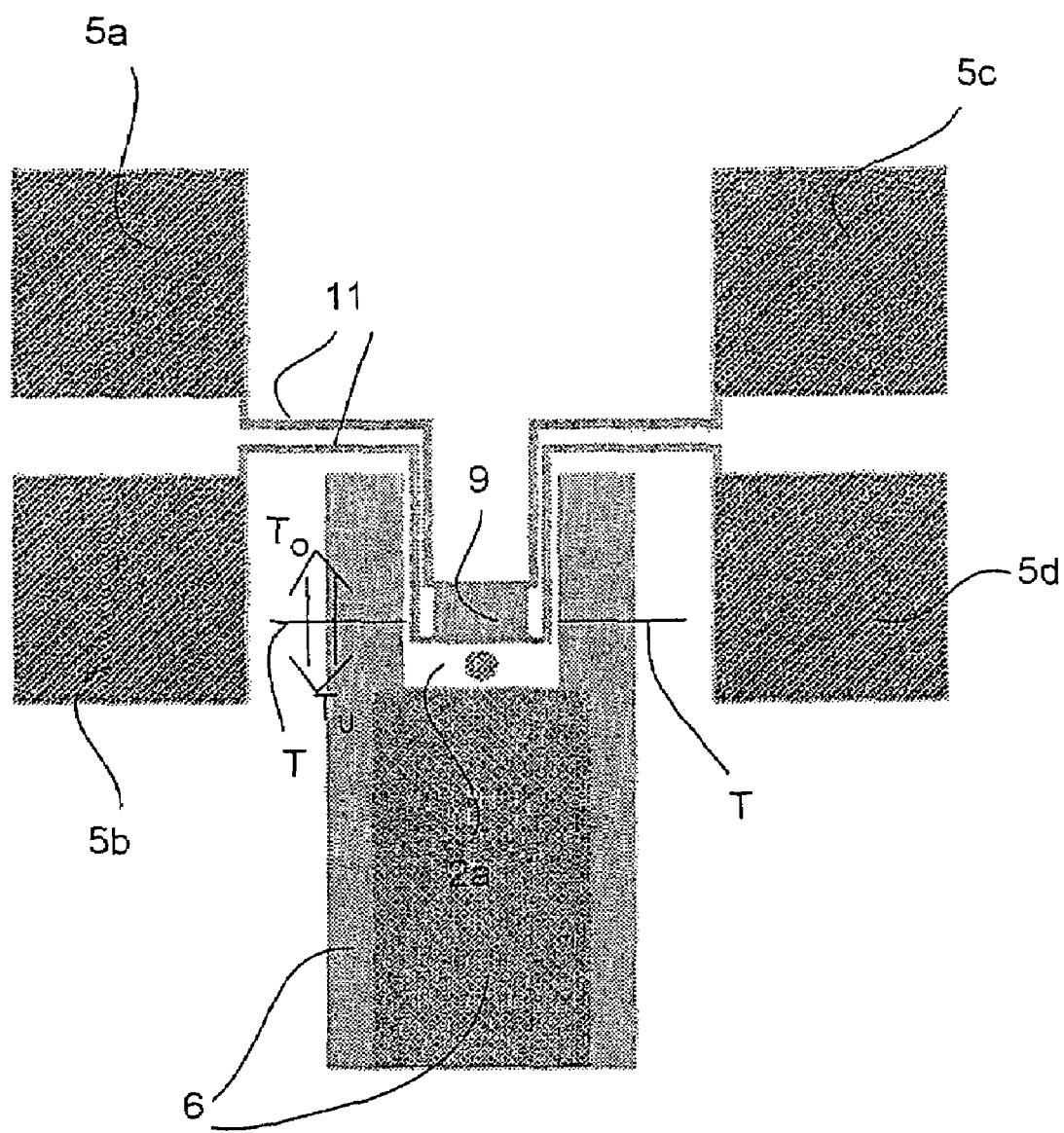
Figure 2F:
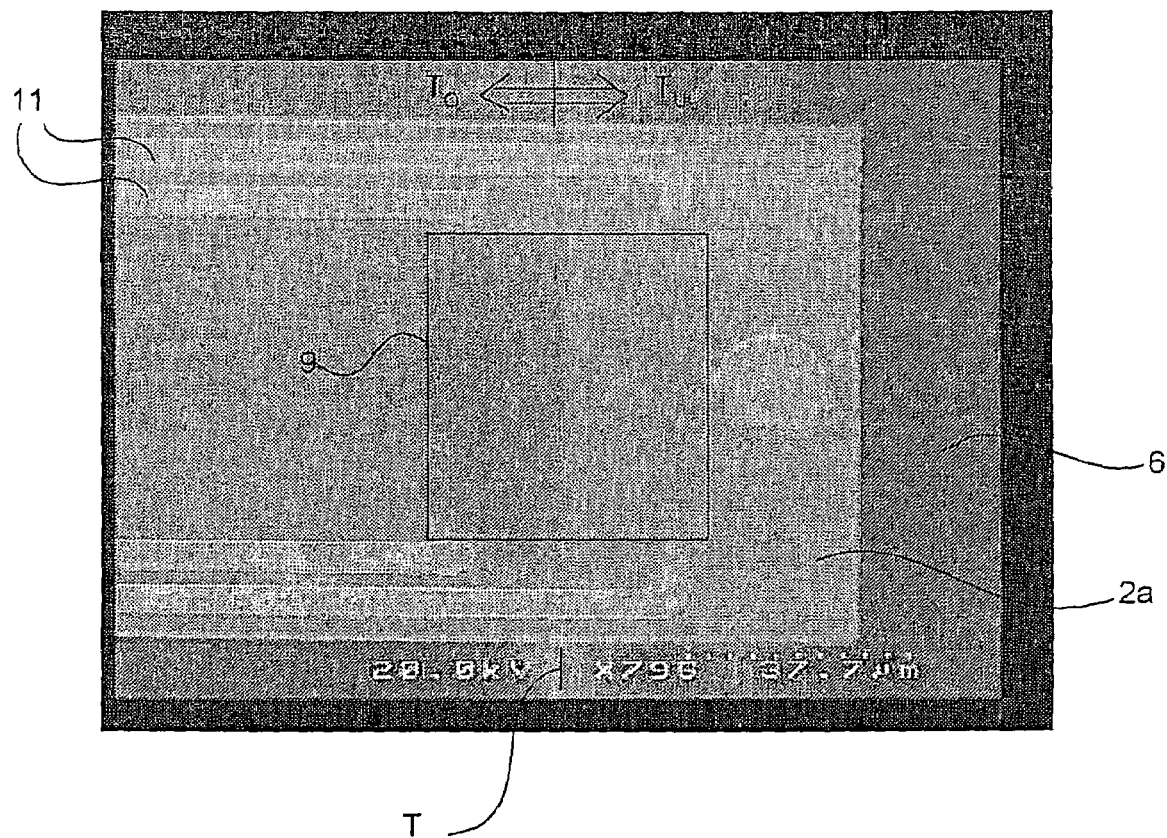

FIGS. 2e and 2f show a further acceleration sensor in the form of an unsupported bar. This subsequently described sensor can however be used in an analogous structure also as a sensor for detecting physical variables other than acceleration. The unsupported bar 2a of a homogeneous semiconductor layer 2 made of GaN has a rectangular mesa 9 or a corresponding raised portion 9. In the case of a heterostructure made of AlGaN/GaN, an AlGaN cover layer is present on the buffer layer made of GaN in the region 9 of the mesa. The contacting in the illustrated case is configured as a four-point structure according to van der Pauw, i.e. the mesa 9 is connected at its four corners via electrical lines 11 to the contacts 5a to 5d. In the region above the separating line T (i.e. in the region $T_o$), the homogeneous semiconductor layer 2 is not cantilevered, in the region below the separating line T (region $T_u$), the homogeneous semiconductor layer 2 is cantilevered (region 2a). The mesa 9 is hence disposed in the transition region cantilevered—non-cantilevered or in part on the non-cantilevered side of the homogeneous semiconductor layer 2 and in part on the cantilevered side (region 2a of the homogeneous semiconductor layer). In the case of the illustrated acceleration sensor, the signal determination is effected by means of the Hall effect. After determination of the layer conductivity and of the Hall resistance, the type of charge carrier, the charge carrier density and the charge carrier movability can be determined therefrom. Alternatively to the embodiment as a four-point structure according to van der Pauw, the circuit can also be configured as a Hall bar structure. The contacts 5a to 5d are ohmic contacts, the supply lines 11 run on the GaN buffer.

Figure 2G:
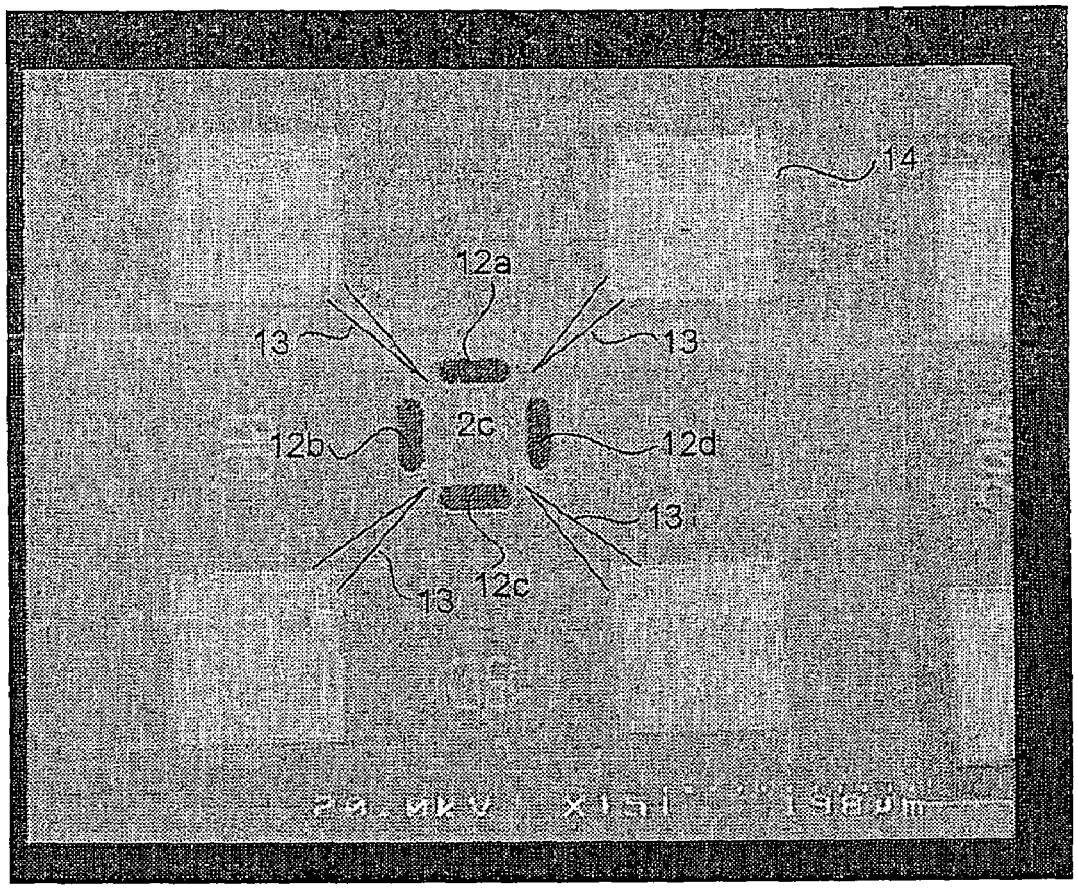
Figure 2H:
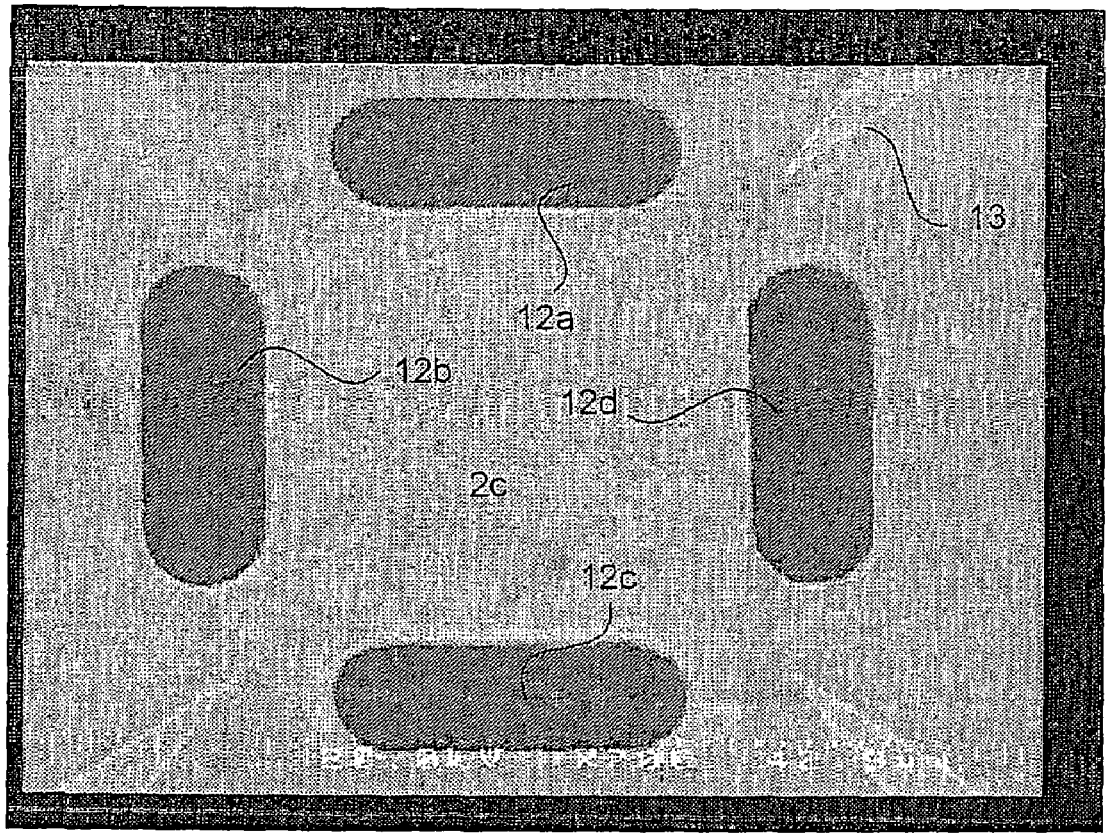

FIGS. 2g and 2h illustrate an alternative embodiment of the van der Pauw structure for use with a Hall effect measurement method. A scanning electron microscopic view of a homogeneous semiconductor structure membrane 2 and four openings 12a to 12d for the etching from above are shown and also four electrical supply lines 13 and four ohmic contacts 14 (the supply lines 13 extend tapering from the contacts 14 in the direction inwardly, i.e. to the region of the openings 12).

After completion of the etching, an unsupported membrane portion 2c is produced in the region of the centre of the image (region 2c), which portion can be deflected for example by a mechanical force or by a flow pressure.

Figure 3A:
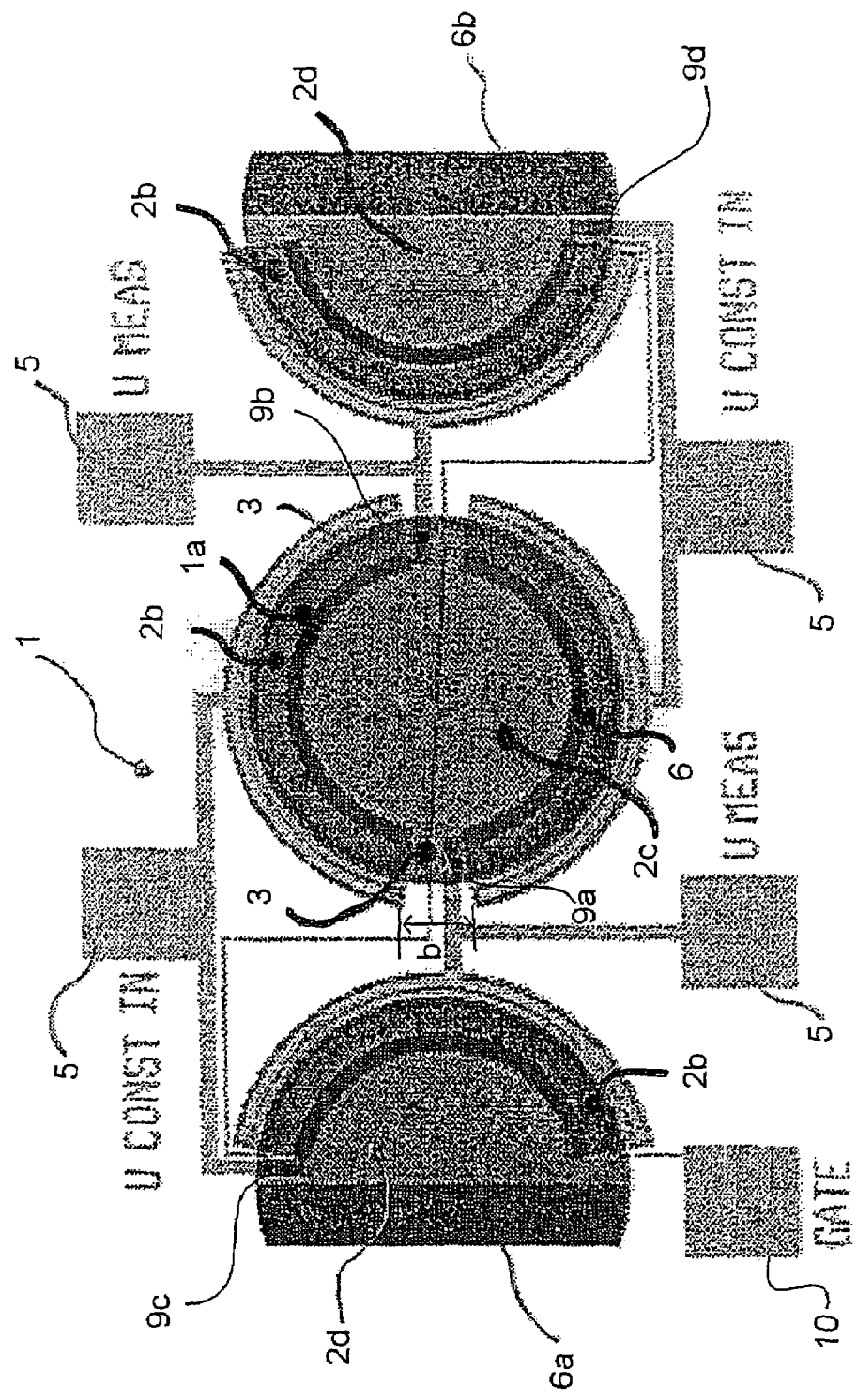
FIG. 3 shows a pressure sensor according to the invention.

FIG. 3a shows a pressure sensor according to the invention which essentially has the same components as the sensors described already in FIGS. 1 and 2. In the case of the present pressure sensor, the cantilevered, deflectable part 2a of the homogeneous semiconductor layer 2 made of GaN is formed as a circular membrane 2c. In the region of the anchor points 3, the membrane 2c has two mesas or raised portions 9a and 9b, in the case of which an AlGaN layer is disposed on the GaN layer. The AlGaN/GaN heterostructure hence exists only in the mesa or resistance region 9. If there is a difference in pressure on both sides of the membrane 2c, then the latter bulges. The etched-out cavity 6 situated thereunder is likewise circular. Due to the bulge, the membrane 2c (cantilevered portions 2a and non-cantilevered portions 2b at the substrate edge 1a) on the substrate edge is distorted as a result of which its polarisation changes: in the heterostructure channel or in the mesa region 9a and 9b, a charge carrier density or accumulation is produced at the interface between the AlGaN and the GaN layer, which is conducted by means of the contacts 5 as output signal. The contacts 5 are disposed directly on the heterostructure channel of the AlGaN/GaN layer sequence.

Figure 3B:
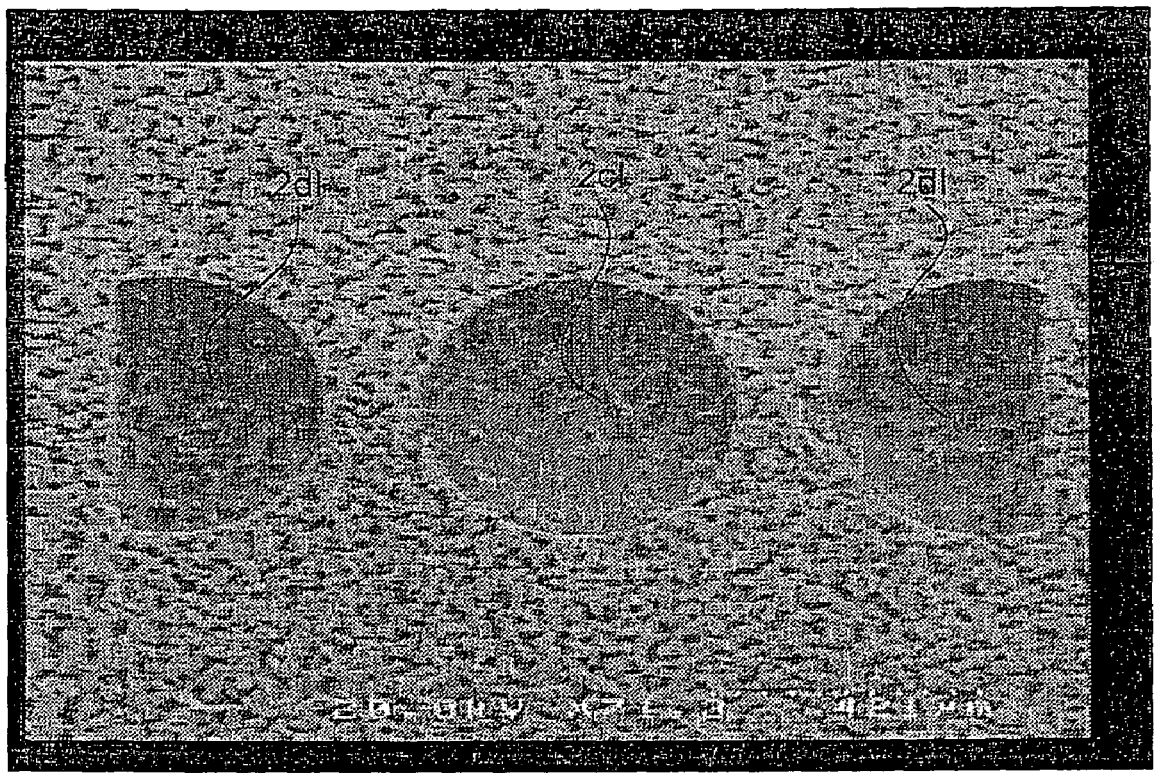

The output signal or change therein is measured via the resistance bars or the mesa regions 9a and 9b. The measurement of the pressure difference between upper and lower side of the membrane 2c is hence effected via the bulge of the same. A temperature independency of the sensor is achieved via a circuit according to Wheatstone. For the correct function of this Wheatstone bridge, two constant reference resistances are required. The two resistors 9c and 9d at the anchor points of the two semicircular membranes 2d on the right and left of the main membrane 2c fulfil this task. As in the case of the membrane 2c, in the case of the membranes 2d a heterostructure is present only in the resistance or mesa region 9 (otherwise only GaN buffer). Both membranes 2d have regions with removed GaN buffer 2 (on the extreme left or extreme right, 6a and 6b), as a result of which no pressure difference and hence no distortion can be formed in the membranes 2d. As a result, both resistors 9c and 9d remain pressure-independent, but not temperature-independent, which makes the circuit insensitive to thermal influences. The reason for the round shape of the membranes is geometrically caused since the distortion at the entire substrate edge 1a is thus equal and the membrane 2c hence obtains its greatest stability. The gate used here optionally and configured preferably as a Schottky contact (in the Figure at the bottom on the left, 10) serves for adjusting the operating point. The mode of operation of the circuit of the pressure sensor illustrated in FIG. 3a is identical to the mode of operation of the circuit for the acceleration sensors described in FIG. 2a to 2d: four resistors 9a to 9d are used, the two resistors 9a and 9b thereof which are on an aneroid diaphragm or membrane 2c and two resistors 9c and 9d on the semicircular membranes 2d. As already described, the membrane 2c can be deflected in the case of high pressure or low pressure above the membrane 2c in comparison to the gas volume enclosed below the aneroid diaphragm or membrane 2c. Due to the regions with removed GaN buffer (6a and 6b), a closed gas volume does not exist at the membranes 2d, therefore the membranes 2d cannot be deflected and the resistors 9c and 9d serve as reference resistances. In the case of a pressure change, the two resistors 9a and 9b on the diaphragm 2c are therefore changed but the two reference resistors 9c and 9d are not. Due to the Wheatstone wiring of the four resistors 9a to 9d, again a change in current (and this in turn independently of interferences, such as for example due to temperature since these interferences act equally on all four resistors and the two reference resistors 9c and 9d are not deflected) can be measured, again without requiring actually to know the value of the resistances 9. The effective resistors 9a to 9d are situated here also again at the transition region 3 of the supported semiconductor 2b to the unsupported 2a and, as described already, are configured in the form of a mesa, i.e. the membranes 2c and 2d themselves are also here only GaN buffers. In contrast to the Wheatstone circuit used in FIGS. 2a to 2d, the width b of the resistors 9a and 9b is essentially higher in order to obtain a higher effect (higher current since a parallel circuit of individual sensor elements is present here so to speak along the direction b of a resistance 9). The use of such wide resistors is not readily possible with an acceleration sensor since the latter has otherwise too few movement possibilities. As an alternative to the illustrated embodiment with gate 10, other embodiments without a gate are also possible. As membrane shapes, those other than circular or semi-circular (e.g. rectangular or square areas) can also be used. FIG. 3b shows a scanning electron microscopic image of the etched-free cavities 2dI and 2cI which are used for the diaphragm 2c or the reference membranes 2d.

Figure 4:
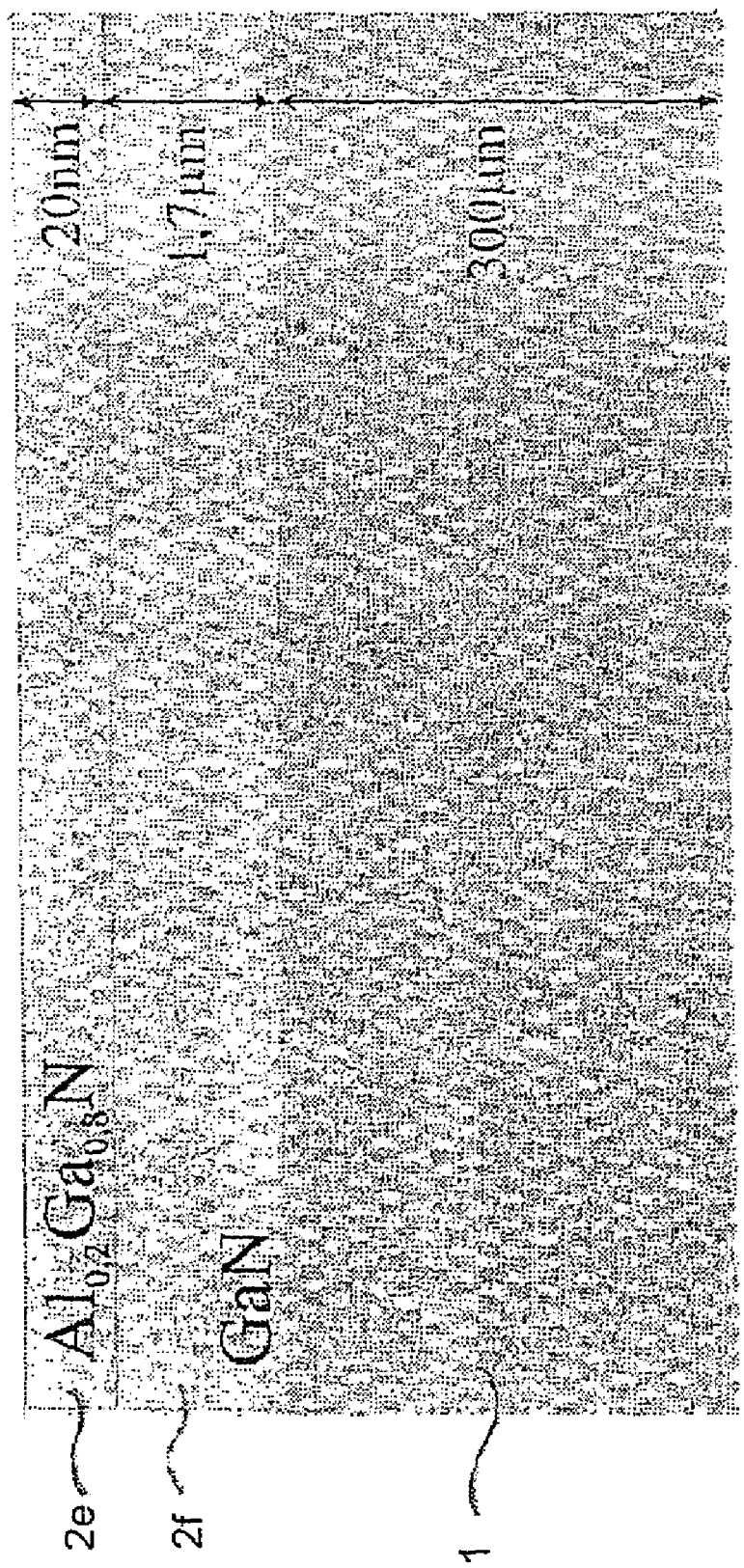
FIG. 4 shows a layer structure of a semiconductor test piece from which a sensor element according to the invention can be produced.

FIG. 4 shows schematically a layer structure of a test piece used to produce an active, cantilevered homogeneous semiconductor layer in the form of a bar. The base of the test piece forms a silicon substrate 1 which is approx. 300 μm thick. An approx. 1.7 μm thick homogeneous semiconductor layer made of GaN 2f is applied on this silicon substrate.

In turn, a cover layer 2e (thickness approx. 20 nm) made of $Al_{0.2}Ga_{0.8}N$ is applied on this layer 2f. A heterostructure sensor element can therefore be produced from the illustrated test piece.

Figure 5:
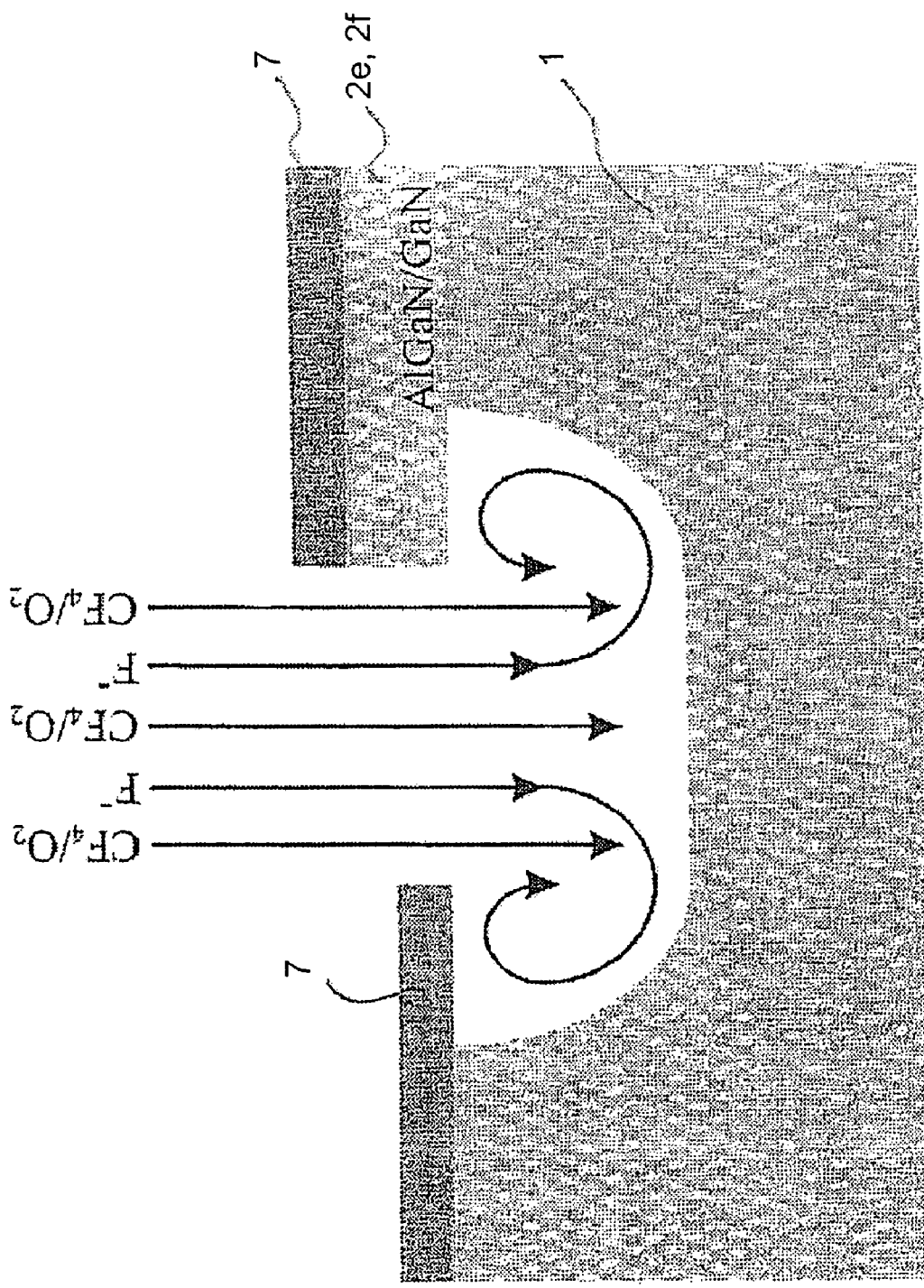
FIG. 5 shows an etching mechanism with which a sensor element according to the invention can be produced.

FIG. 5 shows schematically an essential step, under-etching of the bar structure, in the production of a heterostructure sensor element according to the invention. By means of FIG. 5, firstly all the other steps of the semiconductor structuring method for producing a sensor element according to the invention may be explained. Firstly, from the composite of a homogeneous semiconductor layer 2f and cover layer 2e (GaN or $Al_{0.2}Ga_{0.8}N$), a mesa of a desired surface area is etched out in which the heterostructure 2e, 2f outwith the basic area is etched away down to the substrate base 1. The remaining mesa is shown in FIG. 5 top right (portion 2e, 2f). The regions to be under-etched (mesa region 2e, 2f on the right in the picture and substrate region on the left in the picture) are covered by an aluminium mask 7. The covered regions are subsequently etched by a reactive ion etching method with the assistance of halogens in the reaction gas: the dry etching method used in the example uses a $CF_4$ plasma which is enriched with oxygen. The etching is effected as a result by a mechanical component ($CF_4/O_2$), which is produced by corresponding acceleration of the ions, and also by a chemical etching component ($F^-$ ions).

Figure 6:
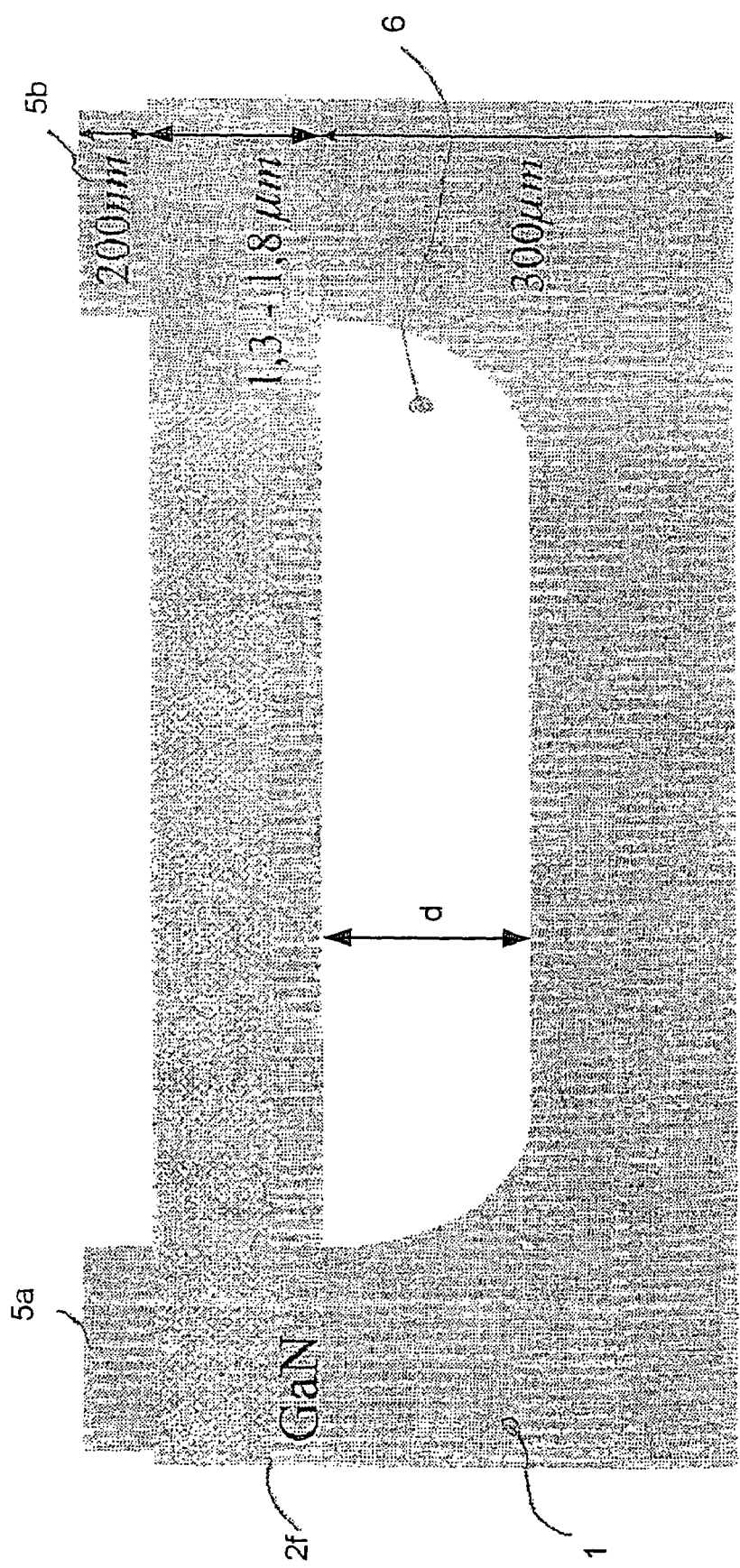
FIG. 6 shows schematically in side view a sensor element according to the invention with a cantilevered bar made of AlGaN/GaN on a silicon substrate.

FIG. 6 shows the basic structure of a cantilevered bar (i.e. one which has a spaced region d which is not filled with a non-metallic and non-semiconducting material) or of a cantilevered homogeneous semiconductor layer 2f made of GaN on a silicon substrate 1 which was produced by means of the etching process described with reference to FIG. 5. The cantilevered bar 2f is supported on the silicon substrate 1 at the left or at the right end. In the centre, the schematically illustrated sensor element shows a cavity 6 below the homogeneous semiconductor layer 2f which was produced by the etching processes illustrated in the description of FIG. 5. The depth of the cavity is approx. d=150 μm. Directly on the top side of the cantilevered active homogeneous semiconductor layer 2f, two contacts 5a (on the left bar end) and 5b (on the right bar end) are fitted, with which the electrical output signal generated upon bending or deflection of the bar 2f can be picked up or conducted.

Figure 7:
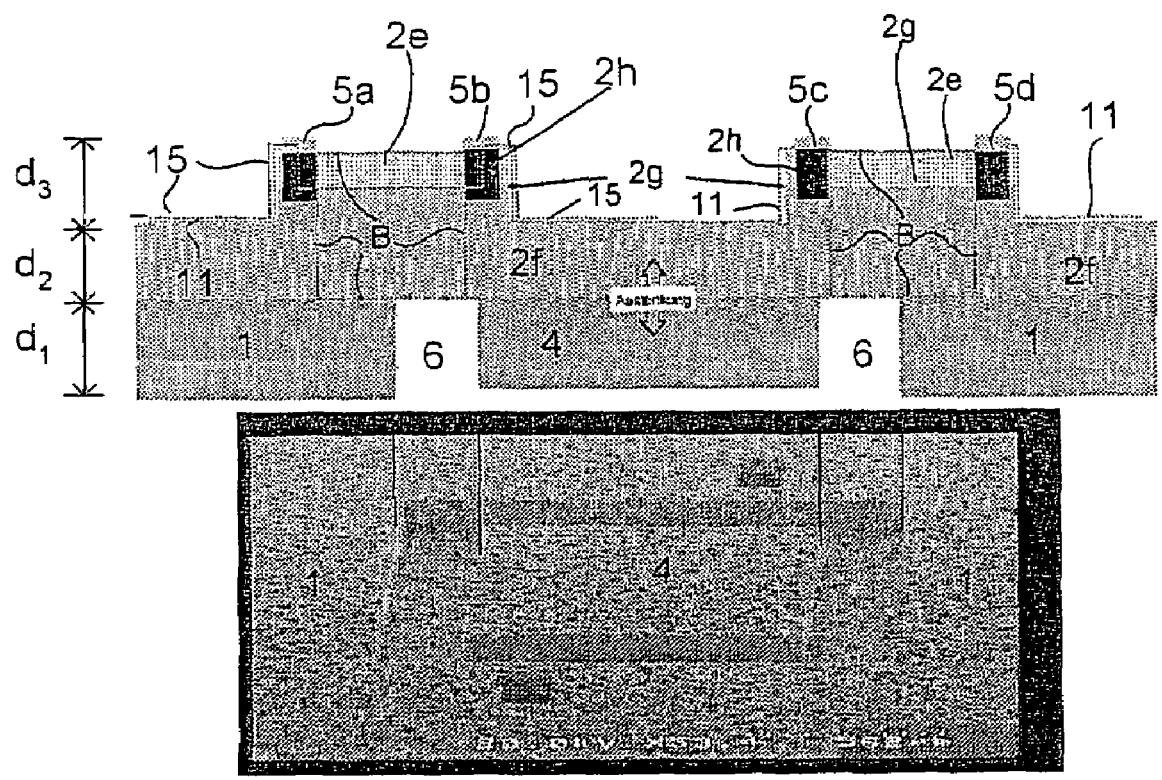
FIG. 7 shows a section through an acceleration sensor with a heterostructure.

FIG. 7 shows an acceleration sensor according to the invention in section. The section plane is hereby perpendicular to the substrate surface. The Figure shows a silicon substrate 1 with a thickness of $d_1$=300 μm A homogeneous GaN semiconductor layer 2f is disposed on this silicon substrate 1. This is under-etched in the middle or in the centre so that, in a cuboid region (cavity 6) below the layer 2f, the substrate 1 was removed at least partially: in the edge region of the cuboid region, the substrate 1 was completely removed (so that the underside of the layer 2f is exposed), in the inner region of the cuboid region, the substrate was not fully removed so that a substrate residue connected to the layer 2f remains, said residue forming a seismic mass 4. In the illustrated structure, the homogeneous GaN semiconductor layer 2f forms hence a cantilevered retaining bar or a membrane which is supported at least at two regions (shown at the side on the left and right) on the substrate 1 and on which the seismic mass 4 is mounted centrally in the middle suspended freely. The seismic mass 4 can hence be deflected upwards or downwards by an acceleration effect (arrows in the picture). On its surface orientated away from the substrate surface, the homogeneous semiconductor layer 2f has two raised portions or two mesa regions. Each of the mesa regions hereby extends in a direction parallel to the substrate surface (in the picture: from the left to the right) or parallel to the surface of the homogeneous semiconductor layer 2f from the region where the layer 2f is supported by the substrate 1 over the region where the layer 2f was stripped from the substrate on its underside up to the region where the seismic mass 4 is disposed below the layer 2f. The thickness of the layer 2f outwith the mesa regions is in the illustrated case $d_2$=1.7 μm (in general it is preferably between 0.5 μm and 3 μm. In the region of the mesas, the layer 2f has here a thickness of 1.93 μm (in general the additional thickness of the layer 2f in the mesa region is preferably between 170 nm and 290 nm. A cover layer 2e made of AlGaN is mounted on the mesas of the layer 2f so that a heterostructure is formed in the mesa region. The cover layer 2e here has a thickness of 20 nm (in general the thickness of the cover layer is preferably between 10 nm and 30 nm) so that a mesa height of $d_3$=250 nm is produced (without contacts 5, see further on). The illustrated acceleration sensor has hence a heterostructure according to the invention. At the interface between the GaN layer 2f and the AlGaN cover layer 2e (i.e. in the mesa region), the heterostructure channel 2g is situated. In each mesa, two contact regions are disposed abutting directly on the heterostructure channel 2g. Respectively one contact region is hereby disposed in the non-cantilevered region (i.e. in the region above the substrate support 1) and a contact region in the cantilevered region (here: above the region where the substrate layer 1 was removed below the layer 2f and in the region of the suspended seismic mass 4). Each of the four illustrated contact regions comprises a contact region, which is produced by alloying, to the heterostructure channel 2g (or to the heterointerface) in the semiconductor layers 2e and 2f (this region is characterised by the reference number 2h) and a metallic contact 5 which is applied above the contact region 2h. The contacts 5 are provided with electrical supply lines 11. If the seismic mass 4 is deflected upwards or downwards by acceleration influences, then an electrical signal is produced in the heterostructure regions or in the mesa regions. The region in which this signal is produced is characterised by the reference number B. The signal is then conducted by the contact regions 2h and the contacts 5a to 5d and also the electrical supply lines 11. This is characterised symbolically by the current flowline 15. The contact regions are hence disposed directly on the heterostructure channel 2g. What is crucial in the case of the described configuration is that in each resistance or mesa region a contact is disposed in a fixed region of the heterostructure or of the layers 2e and 2f (i.e. in a region where the heterostructure or the layer 2f is supported by the silicon substrate 1) and that the other contact of each resistance or mesa region is situated in the freely suspended membrane region or retaining bar region. In the illustrated case, the transition from fixed to free is approximately in the middle below the mesa region. In the case of the present construction, a mesa is hence defined specifically only in one defined longitudinal piece, hence also only one curve occurring in this longitudinal piece contributes to the resultant measurement signal. The mesa regions are disposed advantageously in the region of the largest curves occurring during deflection. Relative to an arrangement in which for example two contacts are disposed in the fixed region (i.e. above the silicon substrate 1) and are connected by a closed heterostructure longitudinal piece which extends partially on a membrane (as a result of which the occurring curves extend in part in opposite directions), the present arrangement has the advantage that a signal component which is caused by the curves extending in opposite directions and consequently being extremely small does not have to be reckoned with but instead there is a significantly higher signal component. In the illustrated case, not all the lengths or elements of an electrically closed path or all the curves in the material contribute therefore, during deflection of the membrane or of the bar, to the signal. In the case of structures according to the invention of the illustrated arrangement, it applies fundamentally that the heterostructure is maintained only in the region of the mesa (then the useful active region of the semiconductor is situated there) and that, outwith the mesa or the corresponding region, the heterostructure is etched away and only a homogeneous layer 2f now remains as residual membrane or residual retaining bar. The situation of the contacts 5 is situated hereby advantageously at the outer edges of the mesa regions. The scanning electron microscopic image illustrated in the lower region of FIG. 7 shows a view of the silicon substrate 1 from below, from which the cuboid region is already etched out and hence the seismic mass 4 can be detected. The sensor illustrated in FIG. 7 and also all the other illustrated sensors can also be configured in forms without a heterostructure (i.e. only with the homogeneous semiconductor layer 2f). The sensor functionality is then ensured by geometric definition of the mesa region. This takes place by suitable etching. The mesa can then obtain suitable etching depths (according to the material) in order to prevent parasitic effects from the abutting, residual membrane material (buffer or non-mesa region). The signal or effect strength hereby changes according to the type of material, it can be assumed that the effect is greatest with bulk material.

Figure 8A:
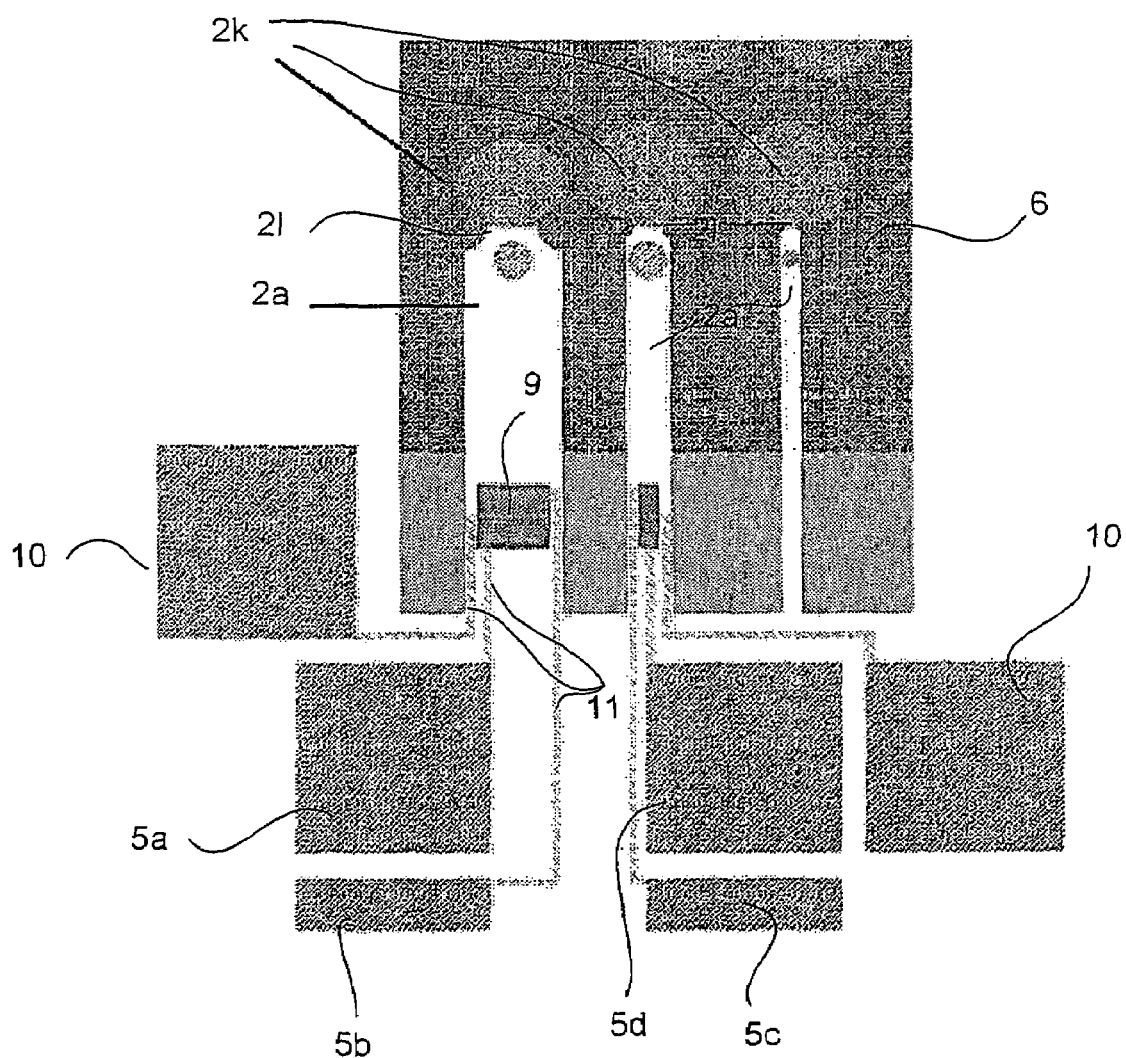
FIG. 8 shows embodiments of bending bars according to the invention.
Figure 8B:
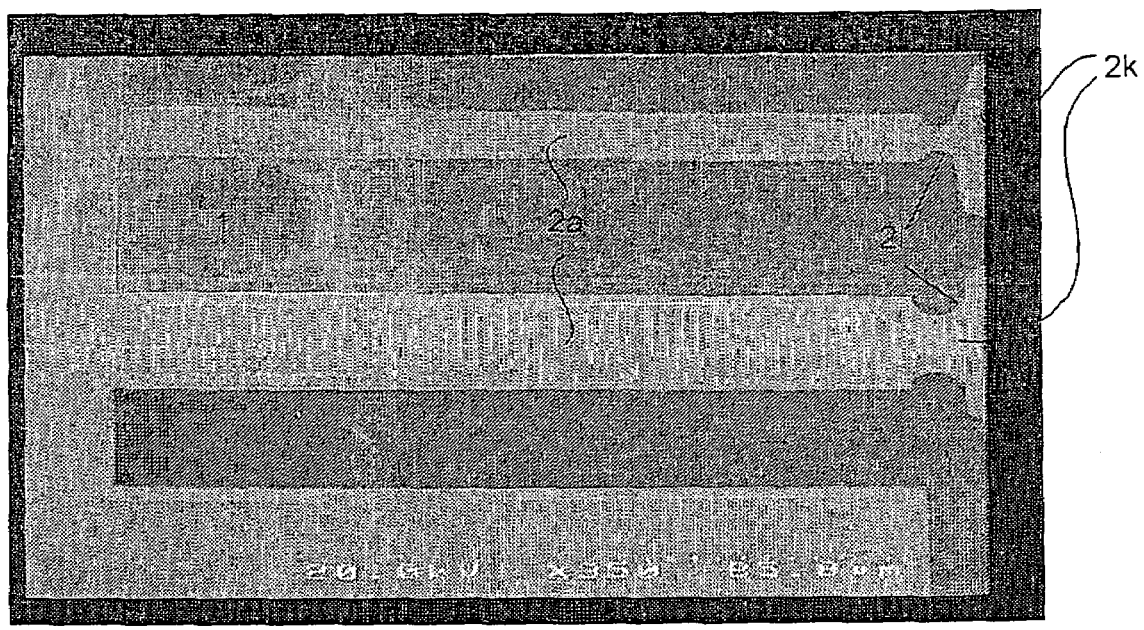
Figure 8C:
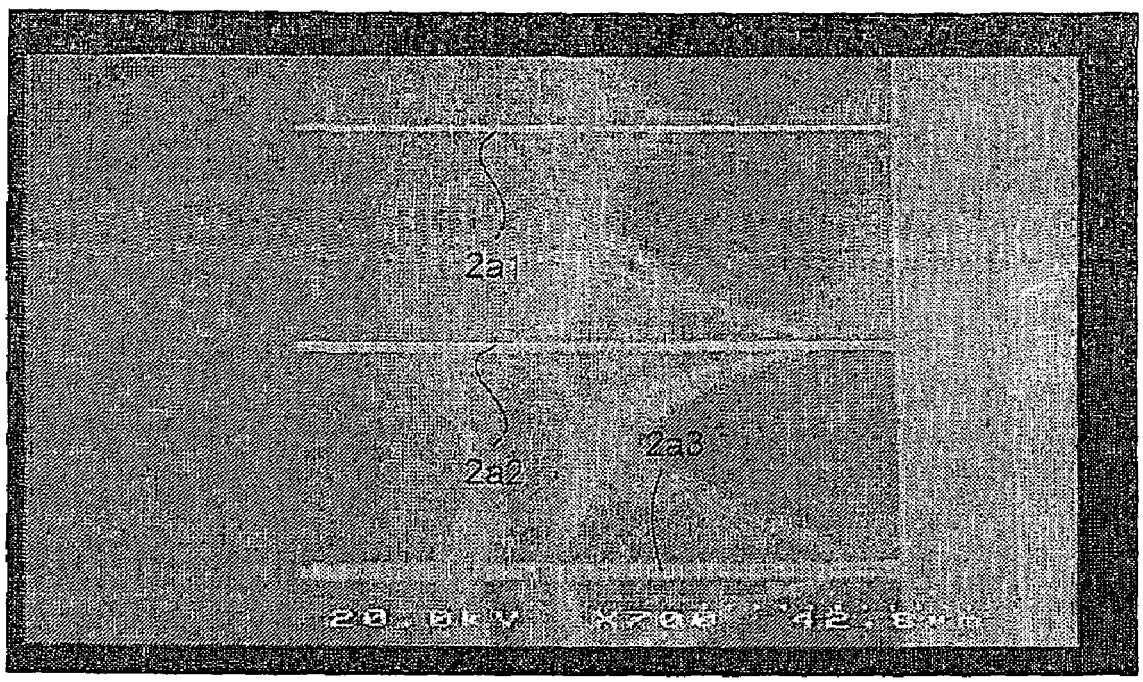

FIG. 8 shows sensor elements according to the invention in the form of cantilevered bars mounted on one side or with an anchor point. These were produced by means of sacrificial membranes mounted at the bar end situated opposite the anchor point. In FIG. 8a, three such bars according to the invention with a cantilevered bar end 2a which is connected initially to a sacrificial membrane 2k via a predetermined breaking point 21, are shown. Four electrical contacts 5a to 5d are shown furthermore which are connected to a mesa 9 via electrical supply lines 11, said mesa, as already described, being disposed partially above the unsupported region and partially above the fixed region of the semiconductor structure layer 2. The illustrated semiconductor structure is produced as follows: the mesa 9 (comprising a proportion of the GaN layer 2f and a proportion of the AlGaN cover layer 2e) is produced by a first etching. The heterostructure is maintained therefore completely only in the region 9 (active region with a current throughflow). The depth in the case of the first etching is in the range of 200 nm to 500 nm. In a second etching step, the region 2f-T is then etched out outwith the mesa 9, said region itself defining the bar structure or the cantilevered bar structure 2a (the GaN is thereby etched away from the top completely down to the substrate 1). This type of structuring of the GaN layers is used preferably when the etching of the cavity 6 is effected from above. If the etching of the cavity 6 is implemented from the rear side (in the picture characterised by the reference number RA), as is the case in the case of use of the ICP standard method with silicon substrates, then etching from above in the form of deep etching suffices (for instance with bars or for defining the bar structure which is designated partially also as "deep mesa") in order to define this geometry, however the described etching can also be applied in two steps. In the illustrated case, the circuit is configured with gates 10. The illustrated sensor elements were produced by dry-chemical etching with the reaction gas $CF_4$ with addition of oxygen from the top side of a [111] silicon substrate. The [111] surface of the silicon substrate is used because of the hexagonal lattice structure of the Group III-nitrides. The etching proceeds fundamentally from the rear side and from the top side. For etching from the rear side, standard methods (ICP, Bosch process) can be used. The etching of the rear side can also be effected with the RIE method (Reactive Ion Etch). The etching of the top side is effected preferably with the RIE method. If a sacrificial membrane 2k with a predetermined breaking point 21, as described, is used, it is possible to produce very long and very narrow bars, for example bars with only 1 µm width, but 100 µm length. This is achieved in that the sacrificial membrane 2k is applied to the subsequently unsupported bar end 2a, which membrane is only separated from the actual bar 2a after etching (by mechanical pressure on the membrane which then breaks at the predetermined breaking point 2k). FIG. 8b shows a scanning electron microscopic image in which two bars 2a which are still connected to the sacrificial membrane 2k via the predetermined breaking point 21, can be seen. FIG. 8c shows three narrow bars (unsupported) 2a1, 2a2 and 2a3 which were produced as described. The uppermost bar 2a1 has a length of 100 µm with a width of 1 µm.

The invention claimed is:

1. Semiconductor sensor element having
   a substrate base (1),
   a homogeneous semiconductor layer (2, 2f) which is disposed on the substrate base (1) and contains semiconductor compounds based on nitrides of the main Group III elements or is formed therefrom,
   the surface of the homogeneous semiconductor layer (2, 2f) orientated towards the substrate base (1) at least partially not abutting directly on the substrate base (1) or having a spacing from the surface of the substrate base (1) orientated towards the homogeneous semiconductor layer (2, 2f),
   wherein at least two electrical conducting contacts (5) for conducting an electrical output signal which can be generated by the homogeneous semiconductor layer (2, 2f) on the basis of a change in a physical variable to be determined by means of the semiconductor sensor element are disposed on, at and/or under the homogeneous semiconductor layer (2, 2f) or are integrated in the latter, and wherein
there is disposed on or at the homogeneous semiconductor layer (2, 2f) on the side thereof oriented away from the substrate base, a cover layer (2e) of $Al_yGa_{1-y}N$ or $In_yGa_{1-y}N$ or $In_yAl_{1-y}N$ with a relative element content of $0<=y<=1.0$, in order to form a heterostructure of semiconductor compounds based on nitrides of the main Group III elements.

2. Semiconductor sensor element according to the preceding claim 1,
wherein
at least one of the contacts (5) is disposed in the region of the region (2a) (spaced region) of the homogeneous semiconductor layer (2, 2f), which region does not abut directly on the substrate base (1) or has a spacing from the surface of the substrate base (1) and in that at least one of the contacts (5) is disposed in the region of a region (2b) (non-spaced region) of the homogeneous semiconductor layer (2, 2f), which region does abut directly on the substrate base (1) or has no spacing from the surface of the substrate base (1).

3. Semiconductor sensor element according to one of the preceding claims 1 or 2,
wherein
the homogeneous semiconductor layer (2, 2f) has a raised region or mesa region (9) which, in the direction perpendicular to the surface of the substrate base (1) orientated towards the homogeneous semiconductor layer (2, 2f), has a greater thickness than a region (non-mesa region) of the homogeneous semiconductor layer (2, 2f), which region abuts on this region (9) in a direction parallel to the surface of the substrate base (1) orientated towards the homogeneous semiconductor layer (2, 2f).

4. Semiconductor sensor element according to the preceding claim 3,
wherein
the raised region or mesa region (9) is disposed such that it extends in a direction parallel to the surface of the substrate base (1) orientated towards the homogeneous semiconductor layer (2, 2f) partially over the spaced region (2a) of the homogeneous semiconductor layer (2, 2f) and such that it extends partially over the non-spaced region (2b) of the homogeneous semiconductor layer (2, 2f).

5. Semiconductor sensor element according to the preceding claim 4,
wherein
the transition from the spaced region (2a) to the non-spaced region (2b) is effected in the direction parallel to the surface of the substrate base (1) orientated towards the homogeneous semiconductor layer (2, 2f) in the region of the centre of the raised region or mesa region (9).

6. Semiconductor sensor element according to claim 3,
wherein
at least one of the contacts (5) is disposed directly on and/or in the region of an outer edge of the raised region or mesa region (9).

7. Semiconductor sensor element according to claim 3,
wherein
the homogeneous semiconductor layer (2, 2f) in the non-mesa region in the direction perpendicular to the surface of the substrate base (1) orientated towards the homogeneous semiconductor layer (2, 2f) has a thickness of above 0.2 µm and/or below 50 µm, in particular of above 0.5 µm and/or below 5 µm, and/or in that the homogeneous semiconductor layer (2, 2f) in the raised region or mesa region (9) has the thickness of the non-mesa region and in addition a thickness of above 20 nm and/or below 1000 nm, in particular of above 50 nm and/or below 300 nm.

8. Semiconductor sensor element according to one of the preceding claims 1 or 2,
wherein
the substrate base (1) contains silicon Si or is formed therefrom.

9. Semiconductor sensor element according to one of the preceding claims 1 or 2,
wherein
the homogeneous semiconductor layer (2, 2f) contains semiconductor structures based on a main group III-nitride in the form of $Al_xGa_{1-x}N$ or $In_xGa_{1-x}N$ or $In_xAl_{1-x}N$ with a relative element content of $0<=x<=1.0$ or is formed therefrom.

10. Semiconductor sensor element according to the preceding claim 9,
wherein
the homogeneous semiconductor layer (2, 2f) contains GaN or is formed therefrom.

11. Semiconductor sensor element according to one of the preceding claims 1 or 2,
wherein
a spatial region present due to the spacing between the homogeneous semiconductor layer (2, 2f) and the substrate base (1) or between their surfaces orientated towards each other is not filled so that the semiconductor layer (2, 2f) relative to the substrate base is at least partially cantilevered.

12. Semiconductor sensor element according to one of the claims 1 or 2,
wherein
a spatial region present due to the spacing between the homogeneous semiconductor layer (2, 2f) and the substrate base (1) or between their surfaces orientated towards each other is filled at least partially with a non-metallic and non-semiconducting material.

13. Semiconductor sensor element according to the preceding claim 12,
wherein, by means of the non-metallic and non-semiconducting material, the heat transfer properties and/or the mechanical properties and/or the high frequency properties of the sensor element can be improved.

14. Semiconductor sensor element according to claim 12,
wherein
the non-metallic and non-semiconducting material contains $SiO_2$ and/or $Si_xN_y$ (in particular SiN) and/or diamond and/or DLC (diamond-like carbon) and/or silicone-like filling materials and/or $Al_2O_3$ and/or thermally conductive plastic materials or is formed therefrom.

15. Semiconductor sensor element according to one of the preceding claims 1 or 2,
wherein
the homogeneous semiconductor layer (2, 2f) is undoped or p-doped or n-doped.

16. Semiconductor sensor element according to one of the preceding claims 1 or 2,
wherein
an extension of the homogeneous semiconductor layer (2, 2f) in a direction essentially perpendicular to its surface orientated towards the substrate base (1) is above 0.2 µm and/or below 50 µm, in particular above 0.5 µm and/or below 5 µm.

17. Semiconductor sensor element according to claim 3, wherein
the cover layer (2e) is disposed only on or at the raised region or mesa region (9) but not in the non-mesa region.

18. Semiconductor sensor element according to one of the claims 1 or 2,
wherein pg,34
the cover layer (2e) is formed from $Al_yGa_{1-y}N$, in particular with $0.1<=y<=0.3$, particularly preferred with $0.15<=y<=0.25$.

19. Semiconductor sensor element according to one of the claims 1 or 2,
wherein
the cover layer (2e) is mechanically distorted and/or in that the extension of the cover layer (2e) in a direction essentially perpendicular to its surface orientated towards the substrate base (1) is in the range of above 5 nm and/or below 1000 nm, in particular in the range of above 10 nm and/or below 200 nm.

20. Semiconductor sensor element according to one of the claims 1 or 2,
wherein
the cover layer (2e) is undoped or p-doped or n-doped.

21. Semiconductor sensor element according to one of the claims 1 or 2,
wherein
there is disposed on or at the cover layer (2e) on the side thereof orientated away from the substrate base, at least one further homogeneous semiconductor layer with $Al_zGa_{1-z}N$ or $In_zGa_{1-z}N$ or $In_zAl_{1-z}N$ with a relative element content of $0<=z<=1.0$.

22. Semiconductor sensor element according to the preceding claim 21,
wherein
the further homogeneous semiconductor layer is undoped or p-doped or n-doped.

23. Semiconductor sensor element according to claim 20, wherein
the doping material content is greater than O atoms per cm³ and/or smaller than $10^{20}$ atoms per cm³ and/or in that the doping material contains silicon Si and/or magnesium Mg or is formed therefrom and/or in that a doped layer has at least one volume doping and/or at least one pulsed doping.

24. Semiconductor sensor element according to one of the preceding claims 1 or 2,
wherein
the electrical conducting contacts (5) are p- and/or n-contacts.

25. Semiconductor sensor element according to the preceding claim 24,
wherein
an n-contact contains Al and/or Ti or is formed therefrom, the thickness of the contact being up to 1000 mm, particularly preferred up to 200 nm.

26. Semiconductor sensor element according to claim 24, wherein
a p-contact has a layer sequence in the subsequently mentioned sequence: an Au layer, an Ni layer and an Au layer, the thickness of each of the layers being preferably up to 1000 mm, particularly preferred up to 200 nm.

27. Semiconductor sensor element according to claim 17, wherein
the electrical conducting contacts (5) are disposed such that, with their help, an electrical output signal produced in the transition region between the homogeneous semiconductor layer (2, 2f) and the cover layer (2e) can be conducted and/or in that the electrical conducting contacts (5) are disposed directly at the interface between the homogeneous semiconductor layer (2, 2f) and the cover layer (2e).

28. Semiconductor sensor element according to one of the preceding claims 1 or 2,
wherein
the electrical conducting contacts (5) have a metallisation.

29. Semiconductor sensor element according to one of the preceding claims 1 or 2,
wherein
the physical variable to be determined is the pressure, the temperature, a force, a deflection and/or an acceleration.

30. Semiconductor sensor element according to one of the preceding claims 1 or 2,
wherein
the change in the physical variable to be determined by the homogeneous semiconductor layer (2, 2f) via a change in the spatial state, shape, volume, structure of a surface and/or a deflection or bulge relative to the substrate base (1) of the semiconductor layer (2, 2f) can be converted directly into the electrical output signal.

31. Semiconductor sensor element according to one of the preceding claims 1 or 2,
wherein
the output signal can be generated by means of piezoelectric properties or mechanical changes in the lattice of the homogeneous semiconductor layer (2, 2f) or represents a change in charge carrier density on a surface of the homogeneous semiconductor layer (2, 2f) or another electrical variable, in particular a current, a voltage or an electrical resistance.

32. Semiconductor sensor element according to one of the preceding claims 1 or 2,
wherein
the homogeneous semiconductor layer (2, 2f) is connected to the substrate base (1) at least one anchor point (3) or abuts on the substrate base (1) via at least one interface to the substrate base (1) such that at least one part (2a) of the part of the homogeneous semiconductor layer (2, 2f), which part is not connected at the anchor point or does not abut on the substrate base (1), can be deflected directly relative to the substrate base (1), by means of a change in the physical variable to be determined relative to the substrate base (1).

33. Semiconductor sensor element according to the preceding claim 32,
wherein
at least two anchor points (3) of the homogeneous semiconductor layer (2, 2f) have a connection in the form of a part (2b) of the homogeneous semiconductor layer (2, 2f), which part cannot be deflected relative to the substrate base (1) or has an interface to the substrate base (1).

34. Semiconductor sensor element according to claim 32, wherein
a deflectable part (2a) of the homogeneous semiconductor layer (2, 2f) is connected to the substrate base (1) via exactly one anchor point (3) such that this deflectable part (2a) is an essentially linear bar, the anchor point (3) being disposed at one of the ends of the bar.

35. Semiconductor sensor element according to claim 32, wherein
a deflectable part (2a) of the homogeneous semiconductor layer (2, 2f) is connected to the substrate base (1) via two anchor points (3) such that this deflectable part (2a) is an essentially linear bar, the two anchor points (3) being disposed at the two ends of the bar.

36. Semiconductor sensor element according to claim 32, wherein
a deflectable part (2a) of the homogeneous semiconductor layer (2, 2f) is connected to the substrate base (1) via two anchor points (3) such that this deflectable part (2a) is an essentially U-shaped bar, the two anchor points (3) being disposed at the two ends of the U or of the bar.

37. Semiconductor sensor element according to claim 32, wherein
a deflectable part (2a) of the homogeneous semiconductor layer (2, 2f) is connected to the substrate base (1) via three anchor points (3) such that this deflectable part (2a) is an essentially Y-shaped bar, the three anchor points (3) being disposed at the three ends of the Y or of the bar.

38. Semiconductor sensor element according to claim 32, wherein
a deflectable part (2a) of the homogeneous semiconductor layer (2, 2f) is connected to the substrate base (1) via four anchor points (3) such that this deflectable part (2a) is an essentially X- or H-shaped bar, the four anchor points (3) being disposed at the four ends of the X or H or of the bar.

39. Semiconductor sensor element according to claim 32, wherein
a deflectable part (2a) of the homogeneous semiconductor layer (2, 2f) is connected to the substrate base (1) via a plurality of anchor points (3) such that this deflectable part (2a) is an essentially double comb-shaped bar, the anchor points being disposed at ends of the comb tines or at ends of the bar.

40. Semiconductor sensor element according to claim 37, wherein
the minimum width of a bar in a given direction which is essentially perpendicular to the deflection direction is above 20 μm and/or below 200 μm and/or in that the arithmetical average of the spacing of anchor points is above 300 μm and/or below 5000 μm.

41. Semiconductor sensor element according to claim 32, wherein
a deflectable part (2a) of the homogeneous semiconductor layer (2, 2f) is formed as a membrane (2c) such that, by means of a difference in the physical variable, in particular in the pressure, on both sides of the membrane (2c), the latter is able to bulge such that, as a result, in this deflectable part (2a) of the homogeneous semiconductor layer (2, 2f) and/or in a part (2b) of the homogeneous semiconductor layer (2, 2f), which part (2b) is connected to said deflectable part (2a) and cannot be deflected relative to the substrate base (1), the output signal can be generated.

42. Semiconductor sensor element according to the preceding claim 41, wherein
the membrane (2c) is essentially circular or semicircular.

43. Semiconductor sensor element according to one of the preceding claims 1 or 2, comprising
at least two electrically connected homogeneous semiconductor layer elements.

44. Semiconductor sensor element according to claim 42, wherein
at least two semicircular membrane-semiconductor layer elements (2d) are connected together with a circular membrane-semiconductor layer element (2c) such that a temperature-independent pressure sensor is produced.

45. Semiconductor sensor element according to claim 32, wherein,
on one deflectable part (2a) of the homogeneous semiconductor layer (2, 2f), a solid body (4), preferably of high density, is disposed or fixed such that the solid body (4) can be deflected directly relative to the substrate base (1) by a change in the physical variable to be determined and, as a result, in this deflectable part (2a) of the homogeneous semiconductor layer (2, 2f) and/or in a part (2b) of the homogeneous semiconductor layer (2, 2f), which part (2b) is connected to said deflectable part (2a) and cannot be deflected relative to the substrate base (1), the output signal can be generated.

46. Semiconductor sensor element according to one of the preceding claims 1 or 2, wherein
the sensor element and/or the homogeneous semiconductor layer (2, 2f) is configured as a functional unit with integrated electrical or electronic circuits which have semiconductor structures based on a main Group III-nitride.

47. Semiconductor sensor element according to the preceding claim 46, wherein
the circuits have diode structures and/or transistor elements and/or temperature sensor elements and/or in that the circuits are compensation circuits or amplifier circuits, in particular for signal amplification.

48. Semiconductor sensor element according to claim 46, wherein
the circuits have Schottky contacts and/or in that the circuits are configured as a Wheatstone bridge.

49. Semiconductor sensor element comprising
a substrate base (1),
a homogeneous semiconductor layer (2, 2f) which is disposed on the substrate base (1) and contains semiconductor compounds based on nitrides of the main Group III elements or is formed therefrom, the surface of the homogeneous semiconductor layer (2, 2f) orientated towards the substrate base (1) at least partially not abutting directly on the substrate base (1) or having a spacing from the surface of the substrate base (1) orientated towards the homogeneous semiconductor layer (2, 2f),
wherein at least two electrical conducting contacts (5) for conducting an electrical output signal which can be generated by the homogeneous semiconductor layer (2, 2f) on the basis of a change in a physical variable to be determined by means of the semiconductor sensor element are disposed on, at and/or under the homogeneous semiconductor layer (2, 2f) or are integrated in the latter,
and wherein a deflectable part (2a) of the homogeneous semiconductor layer (2,2f) is connected to the substrate base (1) via three anchor points (3) such that this deflectable part (2a) is an essentially Y-shaped bar, the three anchor points (3) being disposed at the three ends of the Y of the bar, such that the portion of the Y-shaped bar which part is not connected at the anchor point or does not abut on the substrate base (1), can be deflected directly relative to the substrate base (1), by means of a change in the physical variable to be determined relative to the substrate base (1).

50. Semiconductor sensor element according to claim 49, wherein the homogeneous semiconductor layer (2, 2f) contains semiconductor structures based on a main group III-nitride in the form of $Al_xGa_{1-x}N$ or $In_xGa_{1-x}N$ or $In_xA_{1-x}N$ with a relative element content of $0<=x<=1.0$ or is formed therefrom.

51. Semiconductor sensor element according to claim 50, wherein the homogeneous semiconductor layer (2, 2f) has a raised region or mesa region (9) which, in the direction perpendicular to the surface of the substrate base (1) orientated towards the homogeneous semiconductor layer (2, 2f), has a greater thickness than a region (non-mesa region) of the homogeneous semiconductor layer (2, 2f), which region abuts on this region (9) in a direction parallel to the surface of the substrate base (1) orientated towards the homogeneous semiconductor layer (2, 2f).

52. Semiconductor sensor element according to claim 51, further comprising a cover layer (2e) disposed only on or at the raised region or mesa region (9), but not in the non-mesa region, the cover layer being formed from $Al_yGa_{1-y}N$, in particular with $0.1<=y<=0.3$, particularly preferred with $0.15<=y<=0.25$.

53. Semiconductor sensor element according to claim 51, wherein there is disposed on or at the cover layer (2e) on the side thereof orientated away from the substrate base, at least one further homogeneous semiconductor layer with $Al_zGa_{1-z}N$ or $In_zGa_{1-z}N$ or $In_zAl_{1-z}N$ with a relative element content of $0<=z<=1.0$.

* * * * *

UNITED STATES PATENT AND TRADEMARK OFFICE
CERTIFICATE OF CORRECTION

PATENT NO. : 7,504,658 B2 Page 1 of 1
APPLICATION NO. : 10/549438
DATED : March 17, 2009
INVENTOR(S) : Mike Kunze et al.

It is certified that error appears in the above-identified patent and that said Letters Patent is hereby corrected as shown below:

<u>Column 17</u>

Line 7, delete "pg,34"

<u>Column 21</u>

Line 1, delete "50" and insert --49 or 50--

Signed and Sealed this

Twenty-first Day of April, 2009

JOHN DOLL
*Acting Director of the United States Patent and Trademark Office*